United States Patent
Hotta et al.

(10) Patent No.: US 8,487,412 B2
(45) Date of Patent: Jul. 16, 2013

(54) SEMICONDUCTOR DEVICE AND A METHOD OF MANUFACTURING THE SAME

(75) Inventors: Katsuhiko Hotta, Tokyo (JP); Kyoko Sasahara, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 1 day.

(21) Appl. No.: 13/081,332

(22) Filed: Apr. 6, 2011

(65) Prior Publication Data

US 2011/0183513 A1    Jul. 28, 2011

Related U.S. Application Data

(62) Division of application No. 12/031,046, filed on Feb. 14, 2008, now Pat. No. 7,932,606, which is a division of application No. 11/453,882, filed on Jun. 16, 2006, now Pat. No. 7,354,855.

(30) Foreign Application Priority Data

Jul. 6, 2005    (JP) .................................. 2005-197938

(51) Int. Cl.
*H01L 21/48*    (2006.01)

(52) U.S. Cl.
USPC ............ 257/637; 257/638; 257/622; 257/652

(58) Field of Classification Search
USPC ........... 438/637–638, 125, 652, 622, E21.577
See application file for complete search history.

(56) References Cited

U.S. PATENT DOCUMENTS

| | | |
|---|---|---|
| 6,258,649 B1 | 7/2001 | Nakamura et al. |
| 6,406,995 B1 | 6/2002 | Hussein et al. |
| 6,617,690 B1 | 9/2003 | Gates et al. |
| 6,649,515 B2 | 11/2003 | Moon et al. |
| 6,707,156 B2 | 3/2004 | Suzuki et al. |
| 7,015,133 B2 | 3/2006 | Su et al. |
| 7,052,990 B2 | 5/2006 | Kim |
| 7,323,781 B2 | 1/2008 | Noguchi et al. |
| 2003/0054629 A1 | 3/2003 | Kawai et al. |
| 2003/0054656 A1 | 3/2003 | Soda |
| 2003/0089992 A1 | 5/2003 | Rathi et al. |
| 2003/0111729 A1 | 6/2003 | Leu et al. |
| 2003/0214041 A1 | 11/2003 | Suzuki et al. |

(Continued)

FOREIGN PATENT DOCUMENTS

| | | |
|---|---|---|
| CN | 1499626 A | 5/2004 |
| JP | 2002-526916 T | 8/2002 |

(Continued)

OTHER PUBLICATIONS

Office Action issued Nov. 22, 2011 in Japanese Patent Application No. 2005-197938.

(Continued)

*Primary Examiner* — Tran Tran
(74) *Attorney, Agent, or Firm* — Miles & Stockbridge P.C.

(57) ABSTRACT

For simplifying the dual-damascene formation steps of a multilevel Cu interconnect, a formation step of an antireflective film below a photoresist film is omitted. Described specifically, an interlayer insulating film is dry etched with a photoresist film formed thereover as a mask, and interconnect trenches are formed by terminating etching at the surface of a stopper film formed in the interlayer insulating film. The stopper film is made of an SiCN film having a low optical reflectance, thereby causing it to serve as an antireflective film when the photoresist film is exposed.

19 Claims, 29 Drawing Sheets

U.S. PATENT DOCUMENTS

| | | |
|---|---|---|
| 2004/0084777 A1 | 5/2004 | Yamanoue et al. |
| 2004/0152334 A1 | 8/2004 | Ohto et al. |
| 2004/0222529 A1 | 11/2004 | Dostalik et al. |
| 2004/0235289 A1 | 11/2004 | Suzuki et al. |
| 2005/0001323 A1 | 1/2005 | Watanabe et al. |
| 2005/0153566 A1 | 7/2005 | Han et al. |
| 2008/0099855 A1 | 5/2008 | Nagai et al. |

FOREIGN PATENT DOCUMENTS

| | | |
|---|---|---|
| JP | 2003-92287 A | 3/2003 |
| JP | 2003-124307 A | 4/2003 |
| JP | 2003-163265 A | 6/2003 |
| JP | 2003-528442 T | 9/2003 |
| JP | 2003-338541 | 11/2003 |
| JP | 2004-221275 A | 8/2004 |
| JP | 2004-253503 A | 9/2004 |
| JP | 2004-296515 | 10/2004 |
| KR | 10-2000-0022861 | 4/2000 |
| KR | 10-2003-0024551 | 3/2003 |

OTHER PUBLICATIONS

Office Action issued Jun. 5, 2012, in Japanese Patent Application No. 2005-197938.

Office Action issued Aug. 30, 2012, in Korean Patent Application No. 10-2006-063325.

Search Report and Opinion on Examination issued Sep. 13, 2012, in Taiwanese Patent Application No. 098120878.

SEMICONDUCTOR DEVICE AND A METHOD OF MANUFACTURING THE SAME

CROSS-REFERENCE TO RELATED APPLICATIONS

This application is a division of application Ser. No. 12/031,046, filed Feb. 14, 2008, now U.S. Pat. No. 7,932,606 which is a division of application Ser. No. 11/453,882, filed Jun. 16, 2006 now U.S. Pat. No. 7,932,606. This application also claims priority from Japanese patent application No. 2005-197938 filed Jul. 6, 2005, the content of which is hereby incorporated by reference into this application.

BACKGROUND OF THE INVENTION

The present invention relates to a manufacturing technology of a semiconductor integrated circuit device, in particular, a technology effective when applied to the formation of interconnects using the dual damascene process.

In recent years, a fine-pitch interconnect forming method called damascene process is becoming a leading method in the manufacture of a miniaturized semiconductor integrated circuit device.

The damascene process involves forming a fine interconnect trench in an interlayer insulating film over a semiconductor substrate, depositing a metal film over the interlayer insulating film including the inside of this interconnect trench, removing the metal film outside the interconnect trench by chemical mechanical polishing and forming a minute embedded interconnect in the interconnect trench.

A process called "dual damascene process" is the above-described damascene process but has less steps. It involves the steps of forming, below an interconnect trench formed in an interlayer insulating film, a via hole to be connected to a lower-level interconnect and simultaneously filling a metal film in the interconnect trench and via hole to form an interconnect. A process of forming a metal plug in a via hole in advance and then forming an embedded interconnect in the interconnect trench is called single damascene process.

As a metal material for an embedded interconnect, Cu (copper) is typically employed because reliability is not impaired even by the formation of fine interconnects. When an embedded interconnect is formed in an interlayer insulating film by the damascene process, it is the common practice to make the interlayer insulating film from a low-dielectric insulating material in order to reduce the capacitance generated between two adjacent interconnects. A technology of forming an embedded interconnect in an interlayer insulating film made of a low-dielectric material by the damascene process is described, for example, in Japanese Unexamined Patent Publication No. 2004-221275 or Japanese Unexamined Patent Publication No. 2003-124307.

In Japanese Unexamined Patent Publication No. 2003-163265, disclosed is a manufacturing method of an interconnect layer by the single damascene process, which comprises using an SiCN film as an antireflective film of a resist pattern for the formation of a via hole.

SUMMARY OF THE INVENTION

The outline of the formation steps of a multilevel Cu interconnect by the dual damascene process which were investigated by the present inventors will next be described.
(Step 1) A semiconductor element is formed over a semiconductor substrate and a lower-level interconnect is formed over the semiconductor element in accordance with the conventionally known process.
(Step 2) After deposition of an interlayer insulating film over the lower-level interconnect and formation of an antireflective film over the interlayer insulating film, a photoresist film is formed over the antireflective film. The photoresist film is a film to which a pattern having a via hole formation region opened therein has been transferred by exposure with a photomask having a via hole pattern formed therein and then development. The antireflective film is formed in order to prevent the reduction of the resolution upon exposure of the photoresist film, which will otherwise occur by the exposure light reflected from the surface of the lower-level interconnect and incident on the photoresist film. The antireflective film formed below the photoresist film is also called BARC (bottom anti-reflective coating).
(Step 3) With the photoresist film as a mask, the antireflective film and interlayer insulating film are dry etched to form a via hole in the interlayer insulating film. Then, the photoresist film and antireflective film are removed and a filler is filled in the via hole. The filler is made of an insulating material having a substantially similar composition to that of the antireflective film. The filler is filled in the via hole in the following manner. The filler is deposited over the interlayer insulating film including the inside of the via hole and then the filler outside the via hole is removed by etch back. By this etch back, the surface of the filler filled in the via hole becomes almost flat and becomes on the substantially same level as the surface of the interlayer insulating film.
(Step 4) A second antireflective film is formed over the interlayer insulating film and over this antireflective film, a second photoresist film is formed. This second photoresist film is a film to which a pattern having an interconnect trench region opened therein has been transferred by exposure with a photomask having an interconnect trench pattern formed therein and then development. With the second photoresist film as a mask, the second antireflective film is dry etched and then, the interlayer insulating film is dry etched while leaving a lower portion thereof without etching, whereby an interconnect trench is formed over the via hole.
(Step 5) After removal of the second photoresist film, the second antireflective film is also removed. When the second antireflective film is removed, the filler filled in the via hole is also removed to expose the surface of the lower-level interconnect from the bottom of the via hole. A Cu interconnect is then formed in the interconnect trench and via hole. The Cu interconnect is formed by depositing a Cu film over the interlayer insulating film including the insides of the interconnect trench and via hole by sputtering or plating and then removing the Cu film outside of the interconnect trench by chemical mechanical polishing. A multilevel Cu interconnect is formed over the semiconductor substrate by repeating the above-described Steps 2 to 5.

In the multilevel Cu interconnect formed over a semiconductor substrate, an upper-level interconnect usually has greater width and thickness. Accordingly a via hole formed in an upper interlayer insulating film has greater diameter and depth than a via hole formed in a lower interlayer insulating film.

When a via hole has greater diameter and depth, however, it becomes difficult to completely fill a filler in the via hole in the above-described Step 3. As a result, when after deposition of a filler over an interlayer insulating film including the inside of a via hole, the filler outside of the via hole is removed by etch back, the surface of the filler filled in the via hole does not become flat and there appears a difference between the surface of the filler and the surface of the interlayer insulating film, leading to a problem that in Step 4, an antireflective film cannot be formed uniformly over the interlayer insulating film.

An object of the present invention is to provide a technology of forming a multilevel Cu interconnect in a high yield by the dual damascene process.

Another object of the present invention is to provide a technology capable of simplifying the formation step of a multilevel Cu interconnect by the dual damascene process.

The above-described and other objects and novel features of the present invention will be apparent in the description herein and accompanying drawings.

The outline of typical inventions, of the inventions disclosed by the present application, will next be described briefly.

A manufacturing method of a semiconductor integrated circuit device of the present invention comprises the steps of: (a) forming a semiconductor element over the main surface of a semiconductor substrate and forming a first-level interconnect composed of one or more layers over the semiconductor element; (b) forming a first interlayer insulating film over the first-level interconnect and forming a first stopper film in a portion of the first interlayer insulating film, (c) forming a first antireflective film over the first interlayer insulating film and forming a first photoresist film over the first antireflective film, (d) etching the first antireflective film, the first interlayer insulating film and first stopper film with the first photoresist film as a mask to form a first via hole in the first interlayer insulting film, (e) removing the first photoresist film and first antireflective film and then filling a first filler in the first via hole, (f) after the step (e), forming a second photoresist film over the first interlayer insulating film without using an antireflective film, (g) removing, by etching with the second photoresist film as a mask, the first interlayer insulating film from a region including a region in which the first via hole has been formed, thereby forming a first interconnect trench in the first interlayer insulating film over the first stopper film, and (h) removing the second photoresist film and first filler and then filling a metal film in the first interconnect trench and first via hole to form a second-level interconnect, wherein the first stopper film is made of a material having a low optical reflectance so as to use it as an antireflective film when the second photoresist film formed over the first interlayer insulating film is exposed to transfer a pattern of the first interconnect trench to the second photoresist film.

Advantages available by the typical inventions, of the inventions disclosed by the present application, will next be described briefly.

The present invention enables to form a multilevel Cu interconnect in a high yield by the dual damascene process. In addition, the invention enables to simplify the dual damascene formation step of a multilevel Cu interconnect.

DETAILED DESCRIPTION OF THE PREFERRED EMBODIMENTS

Figure 1:
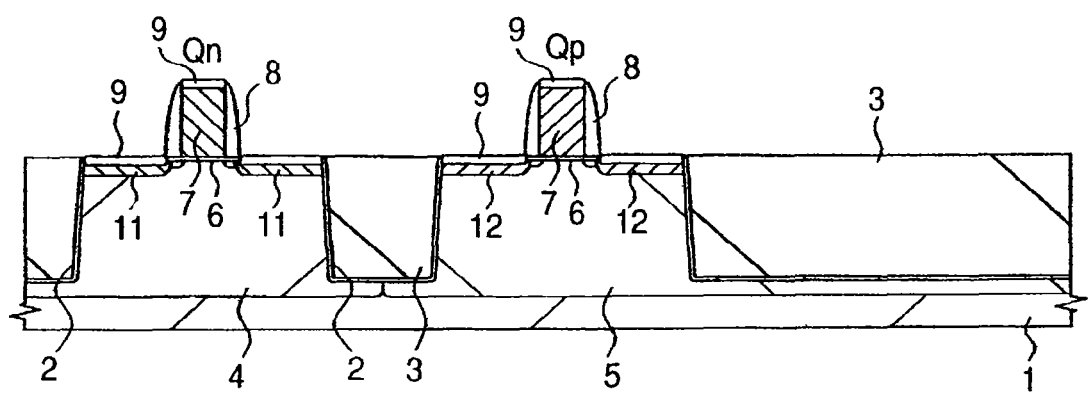
FIG. 1 is a fragmentary cross-sectional view of a semiconductor substrate illustrating a manufacturing step of a semiconductor integrated circuit device according to one embodiment of the present invention.

Embodiments of the present invention will hereinafter be described specifically based on accompanying drawings. In all the drawings for describing the below-described embodiments, members having like function will be identified by like reference numerals and overlapping descriptions will be omitted.

Embodiment 1

A semiconductor integrated circuit device having, for example, a four-layer Cu interconnect and fuse will be described in this Embodiment. A manufacturing method of it will next be described in the order of steps referring to FIGS. 1 to 26.

As illustrated in FIG. 1, an n channel MISFET (Qn) and a p channel MISFET (Qp) are formed as semiconductor elements over the main surface of a semiconductor substrate (which will hereinafter be called "substrate" simply), for example, made of single crystal silicon. In this drawing, indicated at numerals 2, 4 and 5 are element isolation trench, p well and n well, respectively.

The element isolation trench 2 is formed by filling an insulating film, for example, a silicon oxide film 3 in a trench formed by etching the substrate 1. The p well 4 and n well 5 are formed by ion-implanting p type impurity (boron) and n type impurity (phosphorus) into the substrate 1 and heat treating the substrate 1 to diffuse these impurities into the substrate 1.

The n channel MISFET (Qn) is composed of a gate insulating film 6 made of a silicon oxide film or silicon oxynitride film formed over the surface of the p well 4, a gate electrode 7 made of, for example, a polycrystalline silicon film formed over the gate insulating film 6, sidewall spacers 8 made of, for example, a silicon oxide film formed over side surfaces of the gate electrode 7, a pair of n type semiconductor regions (source and drain) 11 formed in the p well 4 on both sides of the gate electrode 7 and the like. The p channel MISFET (Qp) is composed of the gate insulating film 6, gate electrode 7, sidewall spacers 8, a pair of p type semiconductor regions (source and drain) 12 formed in the n well 5 on both sides of the gate electrode 7 and the like. In the polycrystalline film constituting the gate electrode 7 of the n channel MISFET (Qn), an n type impurity (phosphorus) is introduced, while a p type impurity (boron) is introduced into the polycrystalline film constituting the gate electrode 7 of the p channel MISFET (Qp). Over the respective surfaces of the gate electrode 7 and n type semiconductor regions (source and drain) 11 of the n channel MISFET (Qn) and the respective surfaces of the gate electrode 7 and p type semiconductor regions (source and drain) 12 of the p channel MISFET (Qp), a Co (cobalt) silicide film 9 is formed for the purpose of reducing the resistance of each of the gate electrode 7 and source and drain.

Figure 2:
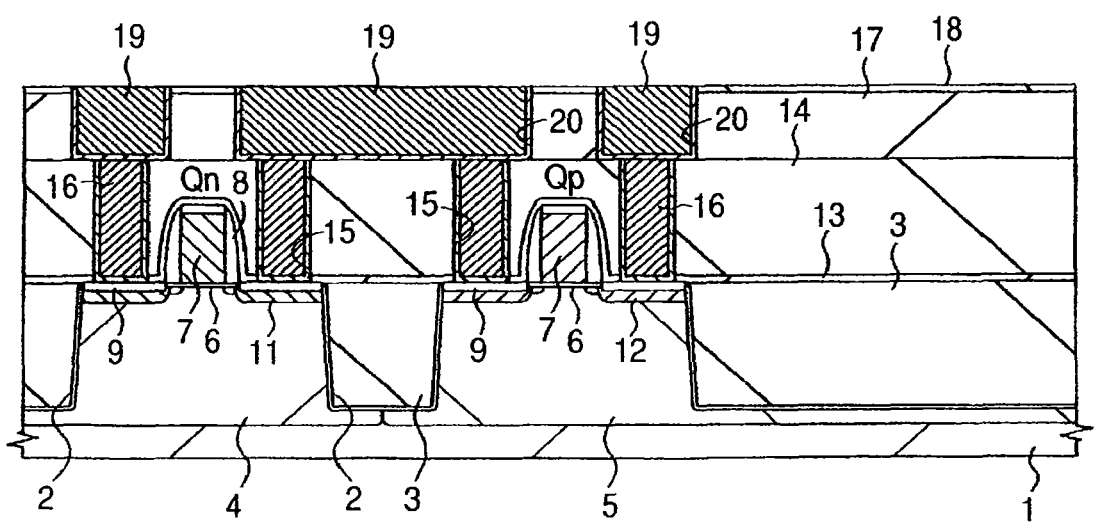
FIG. 2 is a fragmentary cross-sectional view of a semiconductor substrate illustrating a manufacturing step of a semiconductor integrated circuit device following that of FIG. 1.

As illustrated in FIG. 2, a plug 16 and a first-level interconnect 19 are formed over the n channel MISFET (Qn) and p channel MISFET (Qp) and the n channel MISFET (Qn) and p channel MISFET (Qp) are electrically connected to the first-level interconnect 19 via the plug 16.

The first-level interconnect 19 is formed in the following manner. First, after deposition of an etching stopper film 13 and an insulating film 14 over the substrate 1, the surface of the insulating film 14 is planarized by chemical mechanical polishing. The etching stopper film 13 is made of, for example, a silicon nitride film deposited by CVD, while the insulating film 14 is made of, for example, a silicon oxide film deposited by CVD.

Then, the insulating film 14 over each of the n type semiconductor regions (source and drain) 11 of the n channel MISFET (Qn) and p type semiconductor regions (source and drain) 12 of the p channel MISFET (Qp) is etched, followed by etching of the etching stopper film 13 below the resulting insulating film 14 to form a contact hole 15. A plug 16 is then formed inside of the contact hole 15. The plug 16 is made of, for example, a film stack of a TiN (titanium nitride) film and a W (tungsten) film. The TiN film functions as a barrier metal film of the W film. The barrier metal film may be made of a film stack of a TiN film and a Ti (titanium) film.

After deposition of an insulating film 17 (SiOC film 17) of about 200 nm thick and an insulating film 18 of about 50 nm thick made of a silicon oxide film over the insulating film 14 by CVD, the insulating film 18 and SiOC film 17 are dry etched with a photoresist film (not illustrated) as a mask to form an interconnect trench 20. The insulating film 17 (SiOC film 17) is a low dielectric insulating film for reducing the interconnect capacitance and is, for example, an insulating film having a dielectric constant lower than that of a silicon oxide film (for example, TEOS (tetraethoxysilane) oxide film). In general, a film, such as TEOS film, having a specific dielectric constant $\in$ as low as about 4.1 to 4.2 or less is called a low dielectric insulating film. In this embodiment, the specific dielectric constant is about 2.7. The insulating film 18 formed over the SiOC film 17 functions as a protective film for preventing deterioration of the SiOC film 17 having a low mechanical strength which will otherwise occur by chemical mechanical polishing.

A barrier metal film of about 50 nm thick made of a TiN film or a film stack of a TiN film and a Ti film is deposited inside of the interconnect trench 20 by sputtering and then a thick (from about 800 nm to 1600 nm) Cu film capable of completely filling therewith the inside of the interconnect trench 20 is deposited by sputtering or plating. The barrier metal film functions as a film for preventing diffusion of the Cu film in the surrounding insulating film. In addition to the TiN film, various conductive films which hardly react with Cu, for example, metal nitride films such as WN (tungsten nitride) film and TaN (tantalum nitride) film, alloy films obtained by adding Si to such metal nitride films, refractory metal films such as Ta film, Ti film, W film and TiW film, and film stacks of these refractory metal films are usable as the barrier metal film.

The cu film and barrier metal film outside the interconnect trench 20 are removed by chemical mechanical polishing, whereby a metal film composed mainly of Cu is embedded inside of the interconnect trench 20. In such a manner, a first-level interconnect 19 is made of a film stack of the barrier metal film and Cu film remaining inside of the interconnect trench 20.

Figure 3:
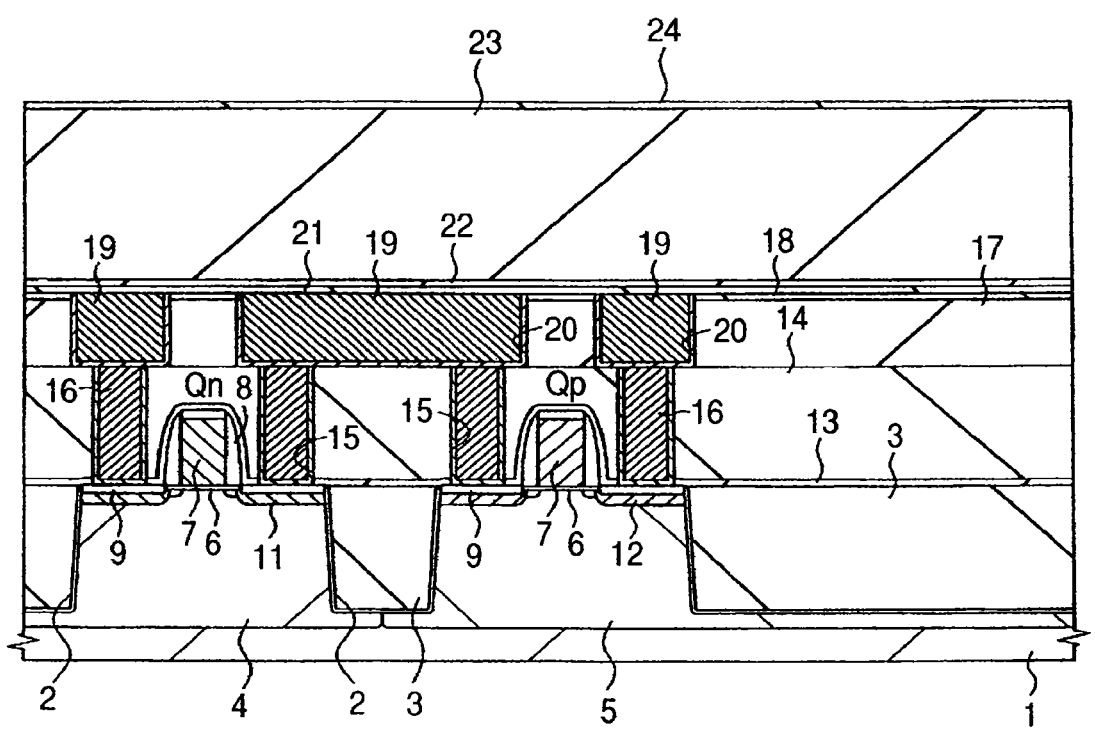
FIG. 3 is a fragmentary cross-sectional view of a semiconductor substrate illustrating a manufacturing step of a semiconductor integrated circuit device following that of FIG. 2.

As illustrated in FIG. 3, barrier insulating films 21 and 22, interlayer insulating film 23 and insulating film 24 are deposited successively over the first-level interconnect 19. The barrier insulating film 21 is an insulating film for preventing the diffusion of Cu, which is a material of the first-level interconnect 19, into the interlayer insulating film 23 and it is made of, for example, an SiCN film having a thickness of from about 20 nm to 100 nm and deposited, for example, by plasma CVD. The barrier insulating film 22 is an insulating film for preventing the diffusion, into the interlayer insulating film 21, of an amine compound contained in the SiCN film constituting the underlying barrier insulating film 21 and it is made of, for example, an SiCO film of from about 10 nm to 100 nm thick deposited by CVD. The diffusion of the amine compound into the interlayer insulating film 23 causes further diffusion of it into a photoresist film formed over the insulating film 23 in the subsequent step, which may deactivate the photosensitive function of the photoresist film.

The interlayer insulating film 23 is made of a low dielectric insulating film, for example, the above-described SiOC film in order to reduce the capacitance formed between the first-level interconnect 29 and a second-level interconnect which will be formed in the later step. The SIOC film is deposited by CVD and its thickness is about 460 nm. A low-dielectric film such as the interlayer insulating film 23 can also be formed by the application method. The insulating film 24 formed over the interlayer insulating film 23 is, similar to the lower insulating film 18, an insulating film for protecting the interlayer insulating film 23 made of an SiOC film having a low mechanical strength when a Cu interconnect is formed by chemical mechanical polishing. It is made of, for example, a silicon oxide film of about 50 nm thick deposited by CVD.

Figure 4:
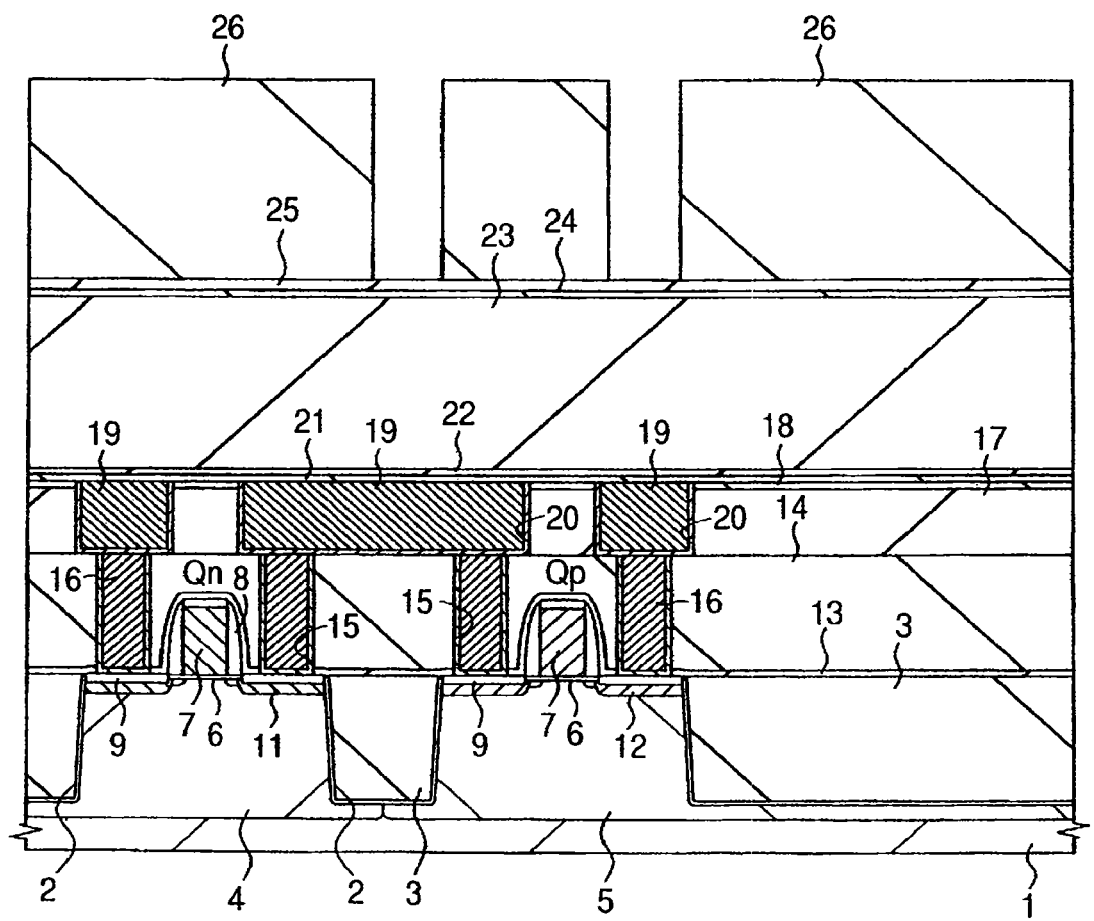
FIG. 4 is a fragmentary cross-sectional view of a semiconductor substrate illustrating a manufacturing step of a semiconductor integrated circuit device following that of FIG. 3.

As illustrated in FIG. 4, an antireflective film 25 is formed over the insulating film 24, followed by the formation of a photoresist film 26 over the antireflective film 25. When the photoresist film 26 is formed, exposure light reflected from the surface of the first-level interconnect 19 is incident on the photoresist film 26 and deteriorates the resolution. The antireflective film 25 is formed for preventing such deterioration in the resolution. The antireflective film is a film called "BARC (bottom anti-reflective coating)" and having a high refractive index than that of the underlying insulating film 24 and interlayer insulating film 23. The photoresist film 26 is a film to which a pattern having an opening corresponding to a via hole formation region has been transferred by the exposure through a photomask (not illustrated) having a via hole pattern formed therein and then development.

Figure 5:
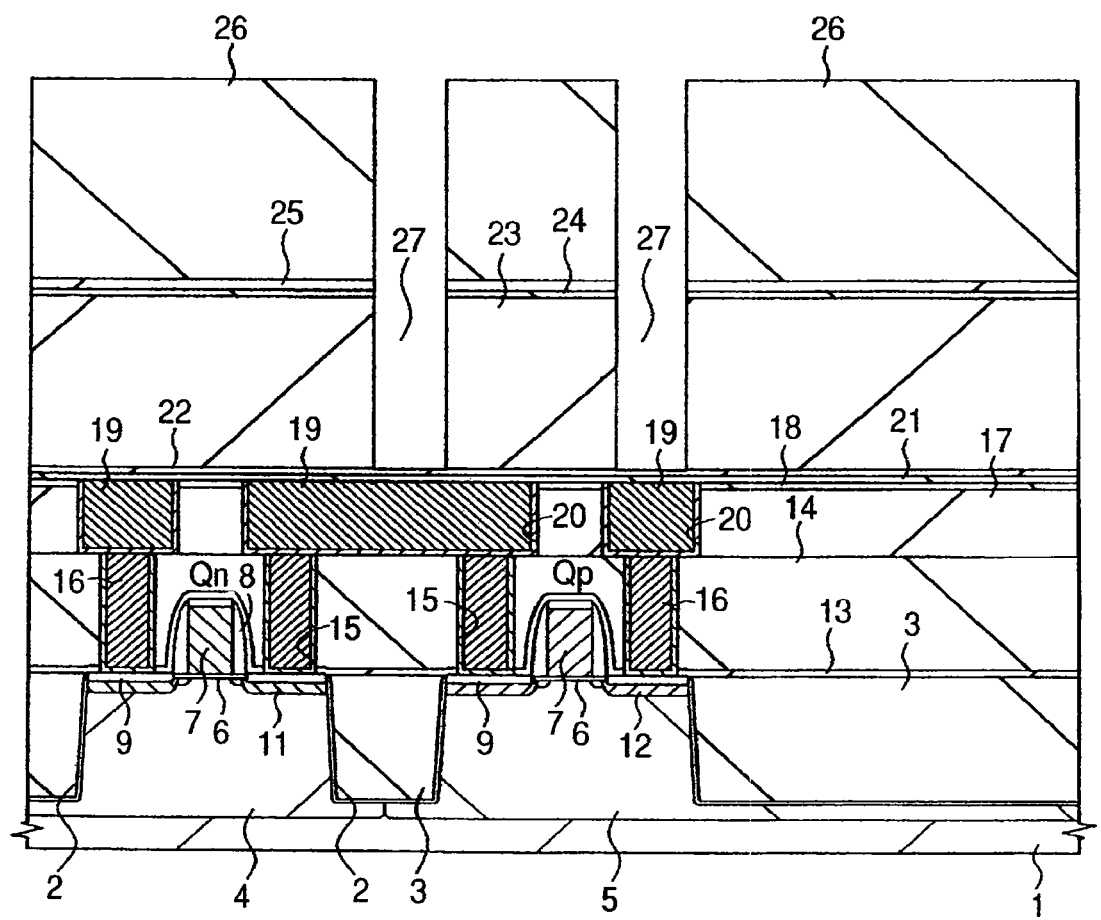
FIG. 5 is a fragmentary cross-sectional view of a semiconductor substrate illustrating a manufacturing step of a semiconductor integrated circuit device following that of FIG. 4.

As illustrated in FIG. 5, the antireflective film 25, insulating film 24 and interlayer insulating film 23 are dry-etched successively with the photoresist film 26 as a mask, whereby a via hole 27 is formed over the first-level interconnect 19.

Figure 6:
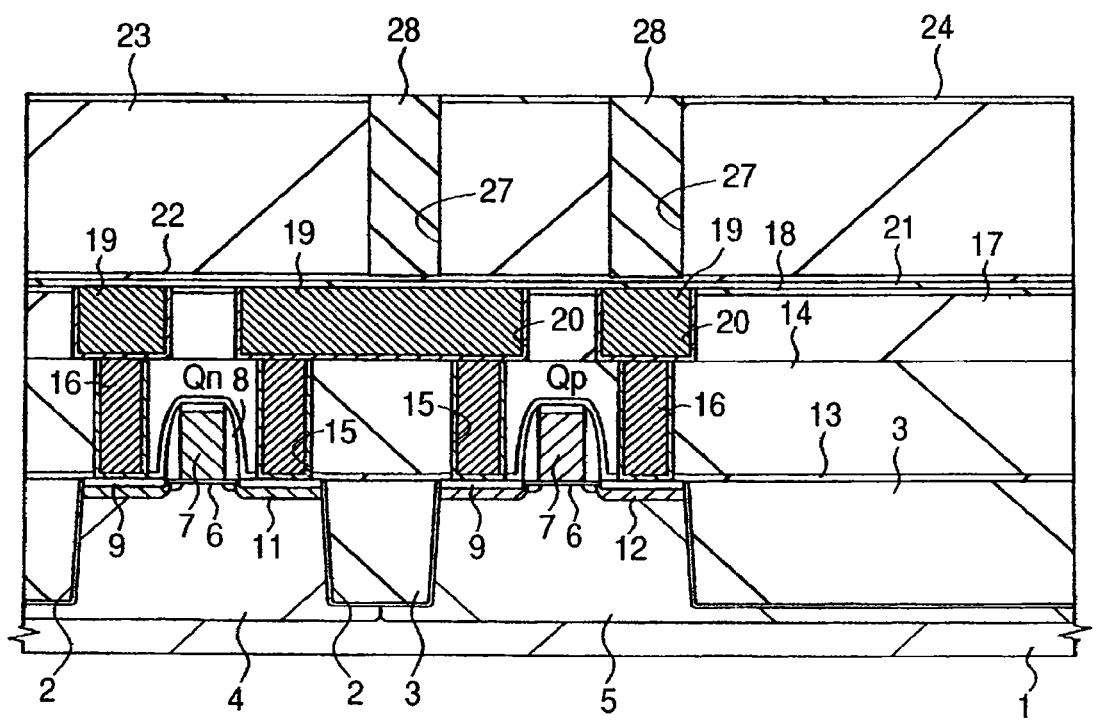
FIG. 6 is a fragmentary cross-sectional view of a semiconductor substrate illustrating a manufacturing step of a semiconductor integrated circuit device following that of FIG. 5.

Then, the photoresist film 26 and antireflective film 25 are removed. When the antireflective film 25 is made of the above-described BARC, it has a composition similar to that of the photoresist film 26 so that the photoresist film 26 and antireflective film 25 can be removed simultaneously by washing once. As illustrated in FIG. 6, a filler 28 is filled inside of the via hole 27. The filler 28 is made of an insulating material having almost a similar composition to that of the antireflective film 25. The filler 28 is filled by spin coating the filler 28 on the insulating film 24 including the inside of the via hole 27, curing it and then, removing the filler 28 outside the via hole 27 by etch back. The diameter of the via hole 27 for connecting the first-level interconnect 19 to a second-level interconnect to be formed later is relatively small so that by employing this etch back, the filler 28 filled in the via hole 27 has almost a flat surface and at the same time, its surface is almost on the same level as that of the insulating film 24.

Figure 7:
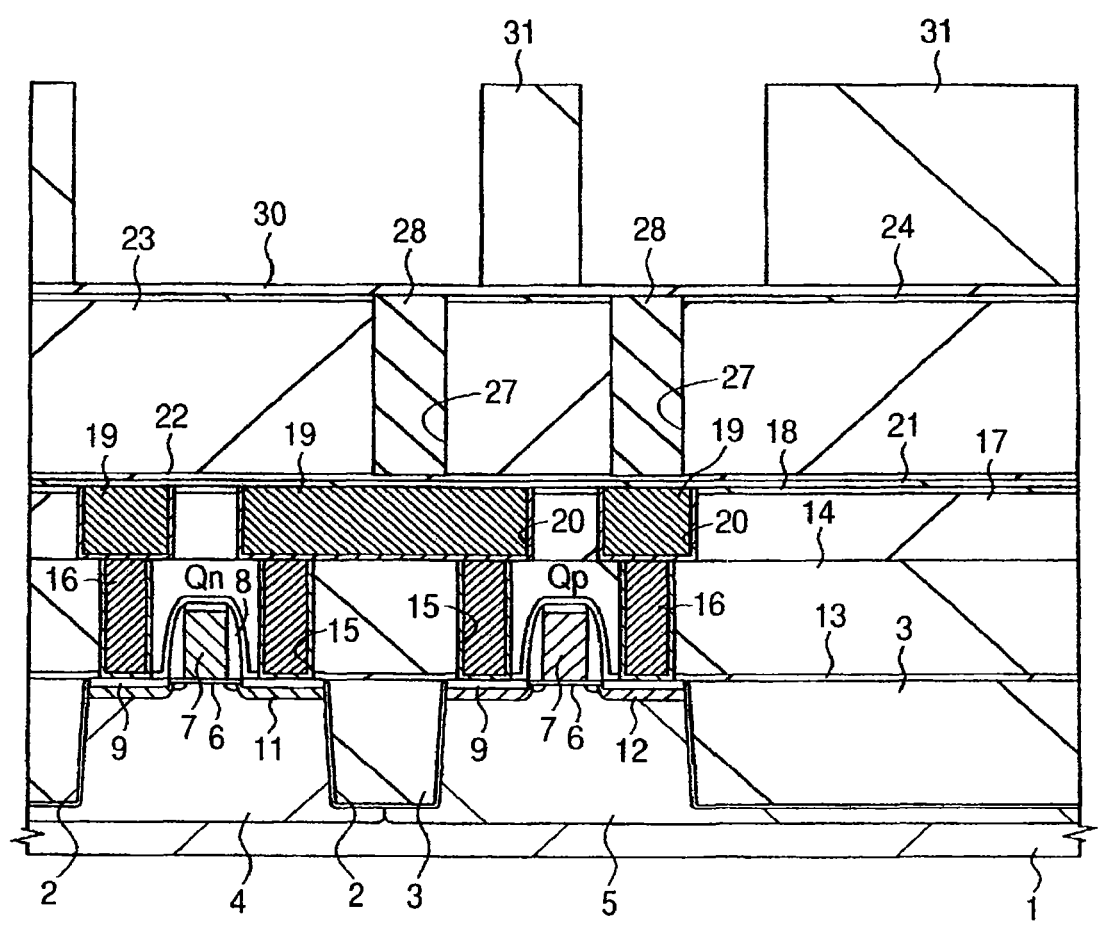
FIG. 7 is a fragmentary cross-sectional view of a semiconductor substrate illustrating a manufacturing step of a semiconductor integrated circuit device following that of FIG. 6.

As illustrated in FIG. 7, an antireflective film 30 is formed over the insulating film 24 and then, a photoresist film 31 is formed over the antireflective film 30. In this Embodiment, the above-described BARC is used as the antireflective film 30. The photoresist film 31 is a film to which a pattern having therein an opening of an interconnect trench formation region has been transferred by the exposure and then development through a photomask (not illustrated) having an interconnect trench pattern formed therein.

Figure 8:
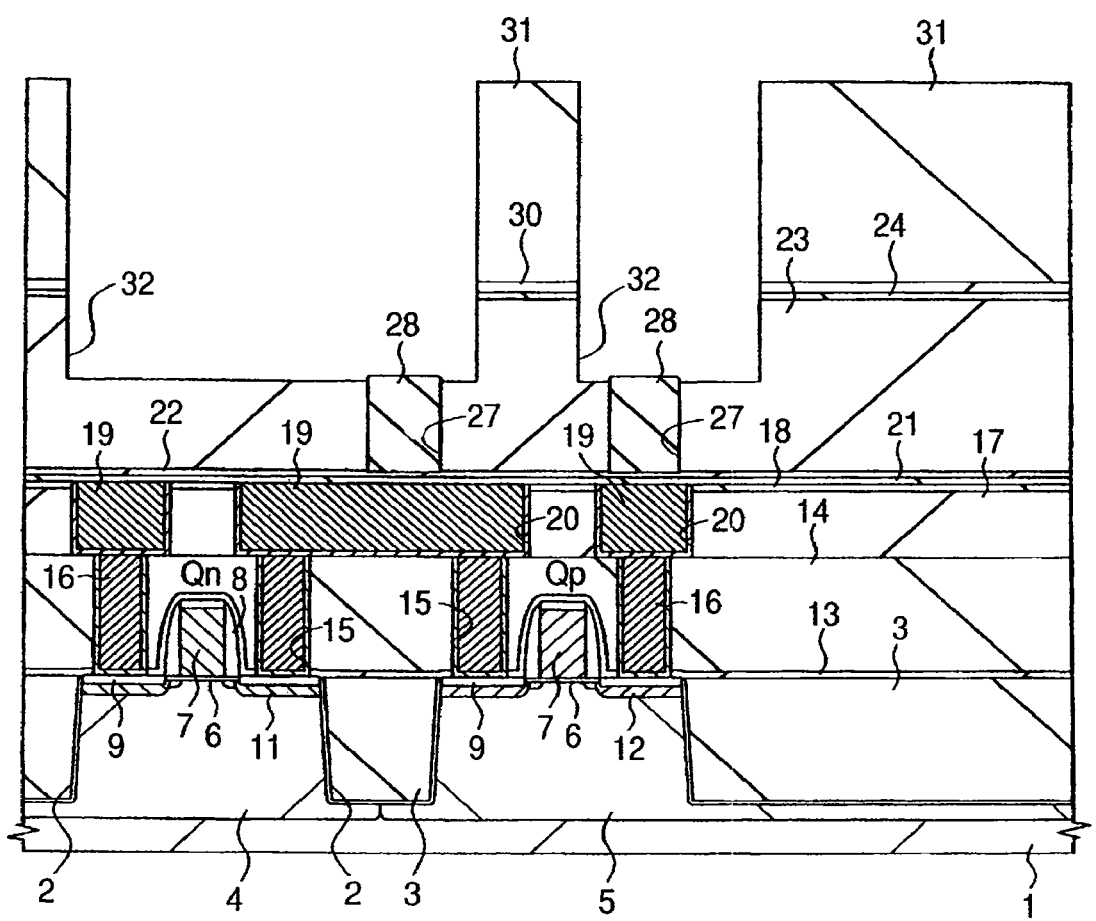
FIG. 8 is a fragmentary cross-sectional view of a semiconductor substrate illustrating a manufacturing step of a semiconductor integrated circuit device following that of FIG. 7.

As illustrated in FIG. 8, the antireflective film 30 and insulating film 24 are dry etched successively with the photoresist film 31 as a mask, followed by dry etching of the interlayer insulating film 23 while leaving a lower portion thereof without etching, whereby an interconnect trench 23 is formed. The interlayer insulating film 23 has no film serving as an etching stopper so that the interconnect trench 23 is formed while controlling the etching time. Formation of a film having a higher dielectric constant than that of the interlayer insulating film 23 inevitably increases an interconnect capacitance because the size of a lower-level interconnect is designed to be finer than that of an upper-level interconnect. In this Embodiment, the interconnect capacitance can be reduced by not forming an etching stopper film in the interlayer insulating film 23. In addition, since the interconnect trench in the lower layer is designed to have a shallower depth than that of the interconnect trench in the upper layer, an etching amount for the formation of the interconnect trench can be reduced. The film thickness can therefore be adjusted by controlling an etching time without disposing an etching stopper film in particular.

Figure 9:
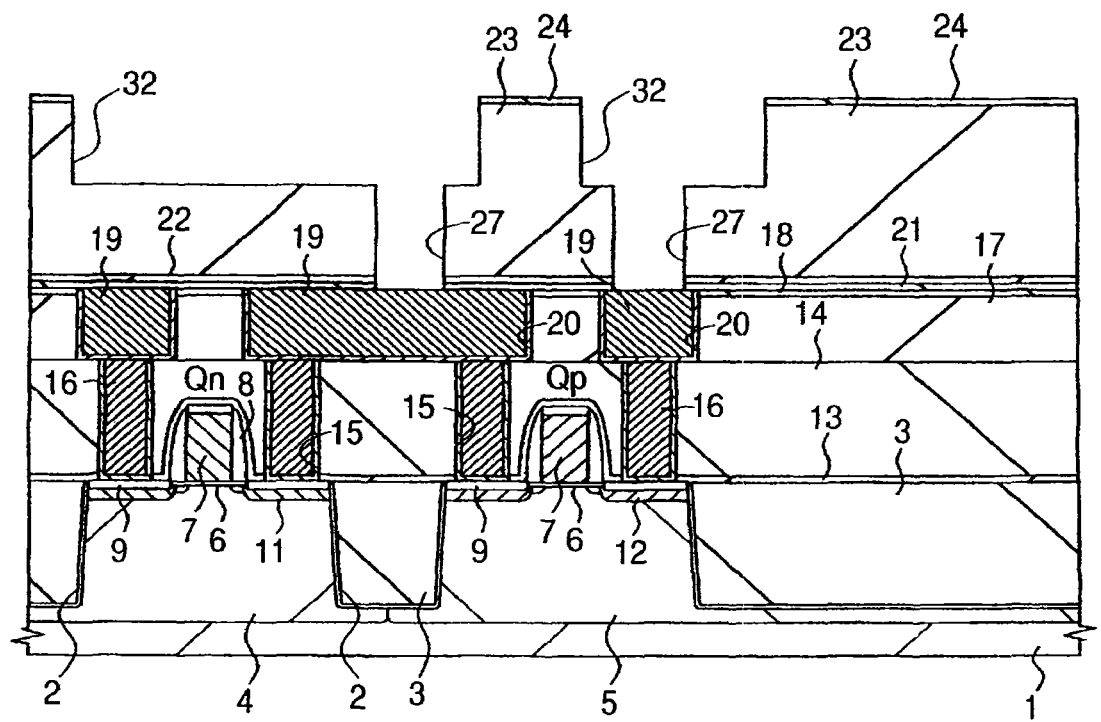
FIG. 9 is a fragmentary cross-sectional view of a semiconductor substrate illustrating a manufacturing step of a semiconductor integrated circuit device following that of FIG. 8.

After removal of the photoresist film 31, the antireflective film 30 over the insulating film 24 is removed by dry etching as illustrated in FIG. 9. The filler 28 filled in the via hole 27 and barrier insulating films 22 and 21 which lie therebelow are etched simultaneously to expose the surface or the first-level interconnect 19 from the bottom of the via hole 27.

Figure 10:
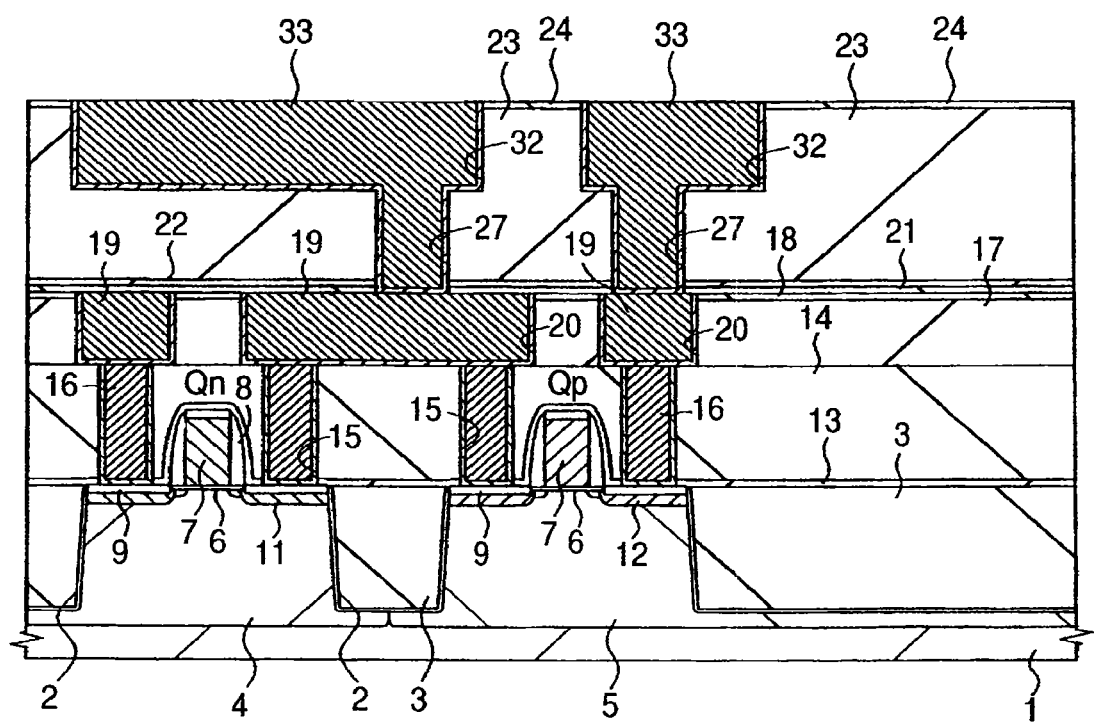
FIG. 10 is a fragmentary cross-sectional view of a semiconductor substrate illustrating a manufacturing step of a semiconductor integrated circuit device following that of FIG. 9.

As illustrated in FIG. 10, a second-level interconnect 33 is then formed inside of the interconnect trench 32 and via hole 27. The second-level interconnect 33 is formed by depositing, by sputtering, a thin TiN film (barrier metal film) having a thickness of about 50 nm over the insulating film 24 including the inside of the interconnect trench 32 and via hole 27. A thick Cu film for filling therewith the interconnect trench 32 and via hole 27 is then deposited over this TiN film by sputtering or plating, followed by removal of the Cu film and barrier metal film existing outside the interconnect trench 32 by chemical mechanical polishing. The insulating film 24 has stronger mechanical strength than the interlayer insulating film 23 so that it serves as a protective film of the interlayer insulating film 23.

Figure 11:
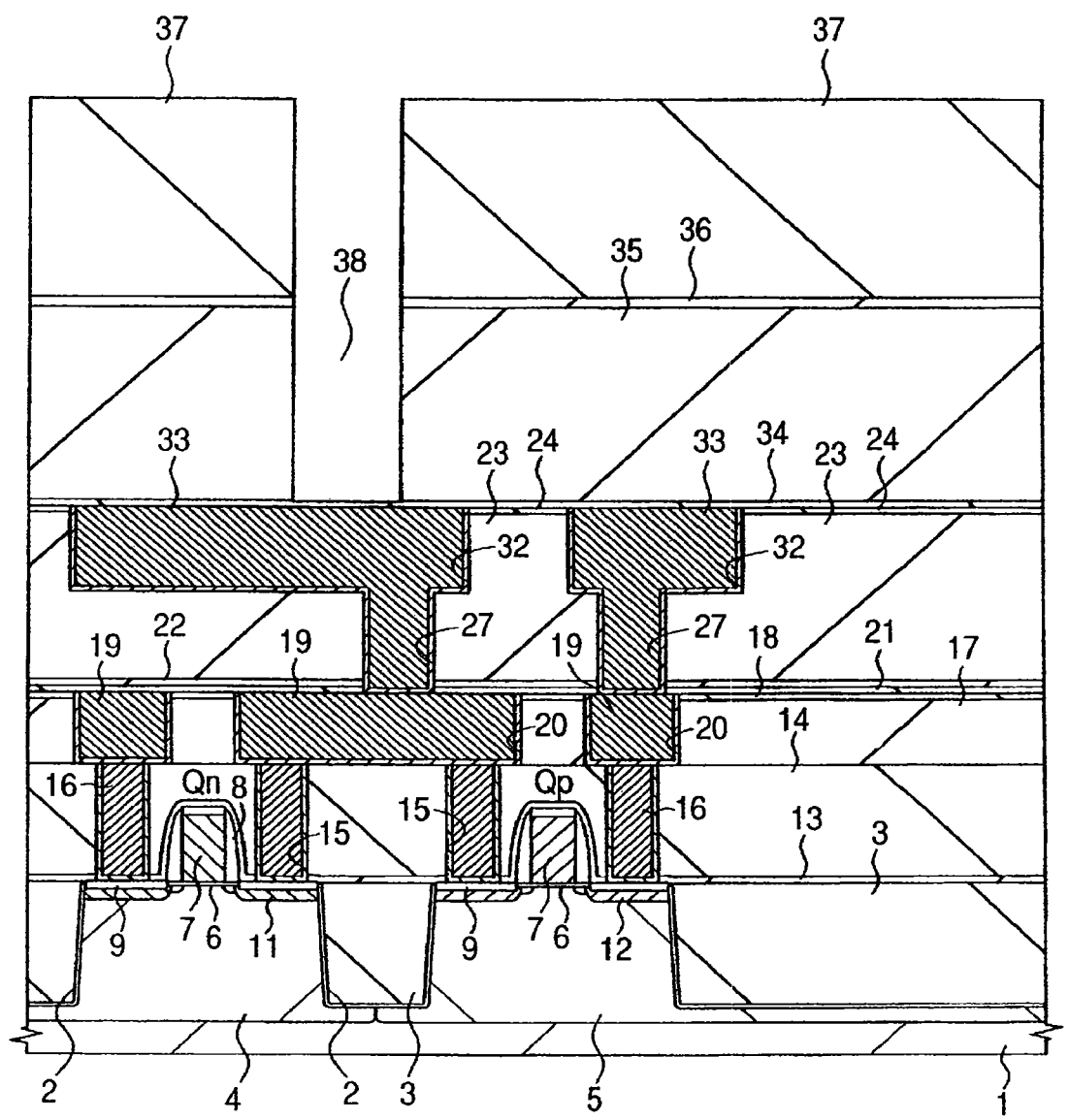
FIG. 11 is a fragmentary cross-sectional view of a semiconductor substrate illustrating a manufacturing step of a semiconductor integrated circuit device following that of FIG. 10.

As illustrated in FIG. 11, after deposition of the barrier insulating film 34, interlayer insulating film 35 and antireflective film 36 over the second-level interconnect 33, the antireflective film 36 and interlayer insulting film 35 are dry etched with the photoresist film 37 formed over the antireflective film as a mask, whereby a via hole 38 is formed over the second-level interconnect 33.

The barrier insulating film 34 is, similar to the barrier insulating film 21 for covering therewith the surface of the first-level interconnect 19, an insulating film for preventing the diffusion of Cu, which is an interconnect material, in the interlayer insulating film 35 and it is made of an SiCN film of about from 20 nm to 100 nm thick deposited, for example, by plasma CVD.

In a multilevel interconnect formed over the substrate 1, an interconnect capacitance of an upper-level interconnect becomes smaller that of a lower-level one because the distance between two adjacent interconnects is wider in the upper-level interconnect. When the capacitance between two third-level interconnects which will be formed later or between the third-level interconnect and the second-level interconnect is not an important factor, the interlayer insulating film 35 is made of a silicon oxide film of about 700 nm thick deposited, for example, by CVD. Since a silicon oxide film has a denser film quality than an SiCO film which is a low dielectric material, diffusion of an amine compound does not become a problem even when the interlayer insulating film 35 made of a silicon oxide film is deposited directly over the barrier insulating film 34 made of an SiCN film. Since the SiCN film has comparatively low adhesion to a silicon oxide film, the adhesion between the barrier insulating film 34 and the interlayer insulating film 35 may be improved by forming an SiCO film therebetween. As a silicon oxide series material constituting the interlayer insulating film 35, silicon oxide added with F (fluorine) for reducing its dielectric constant may be used.

When a capacitance between two third-level interconnects (43) or between the third-level interconnect and the second-level interconnect is an important factor, on the other hand, the interlayer insulating film 35 is made of a low dielectric material such as SiCO film. In this case, it is desired to form an SiCO film between the barrier insulating film 34 and the interlayer insulating film 35 to prevent the diffusion of an amine compound in the barrier insulating film 34. In the below description, the interlayer insulating film 35 is made of a silicon oxide film.

Figure 12:
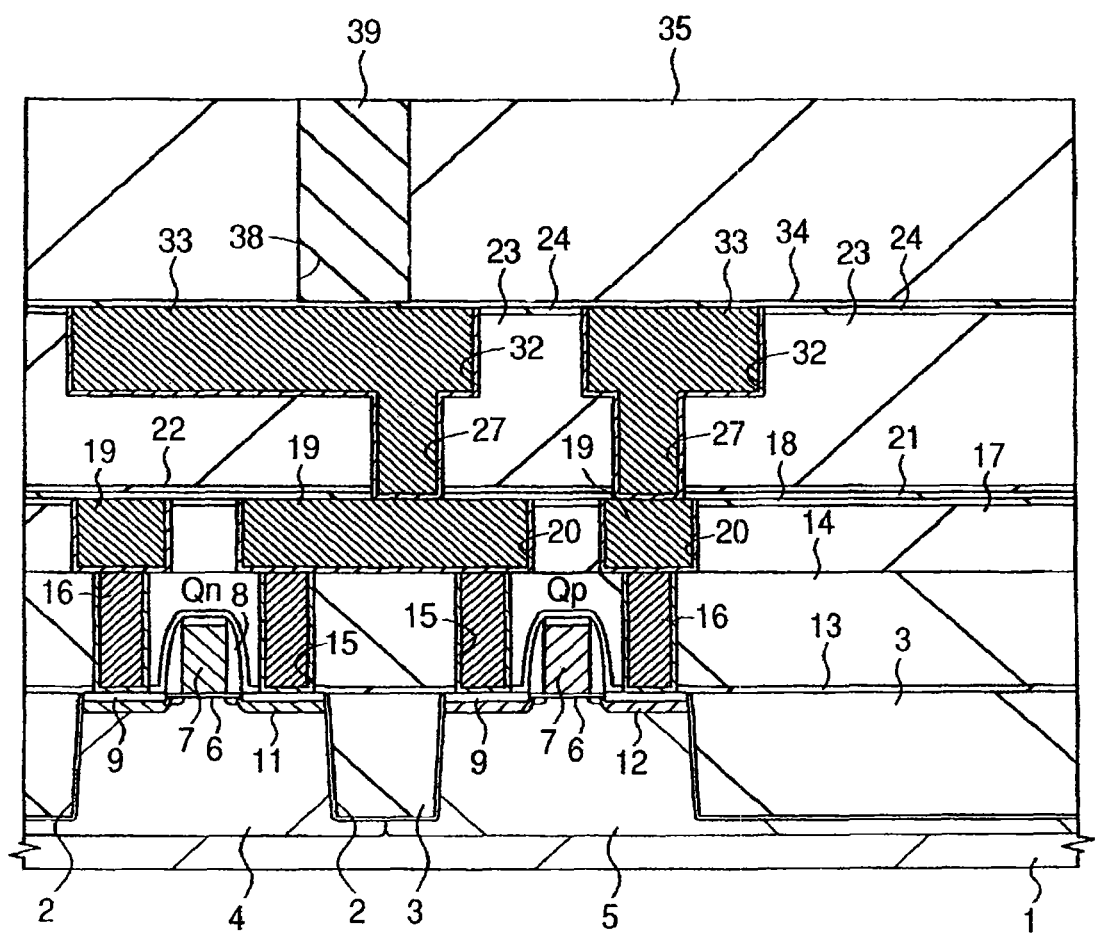
FIG. 12 is a fragmentary cross-sectional view of a semiconductor substrate illustrating a manufacturing step of a semiconductor integrated circuit device following that of FIG. 11.

After removal of the photoresist film 37 and antireflective film 36, a filler 39 is filled in the via hole 38 as illustrated in FIG. 12. As described above, the filler 39 is made of an insulating material having almost a similar composition to that of the above-described antireflective film. The filling method of the filler 39 is also similar to that employed for filling the filler 28 in the via hole 27. Since the diameter of a via hole 38 for connecting the second-level interconnect 33 to a third-level interconnect which will be formed later is relatively small, the surface of the filler 39 filled in the via hole 38 is almost flat and at the same time is on the same level with the surface of the interlayer insulating film 35.

Figure 13:
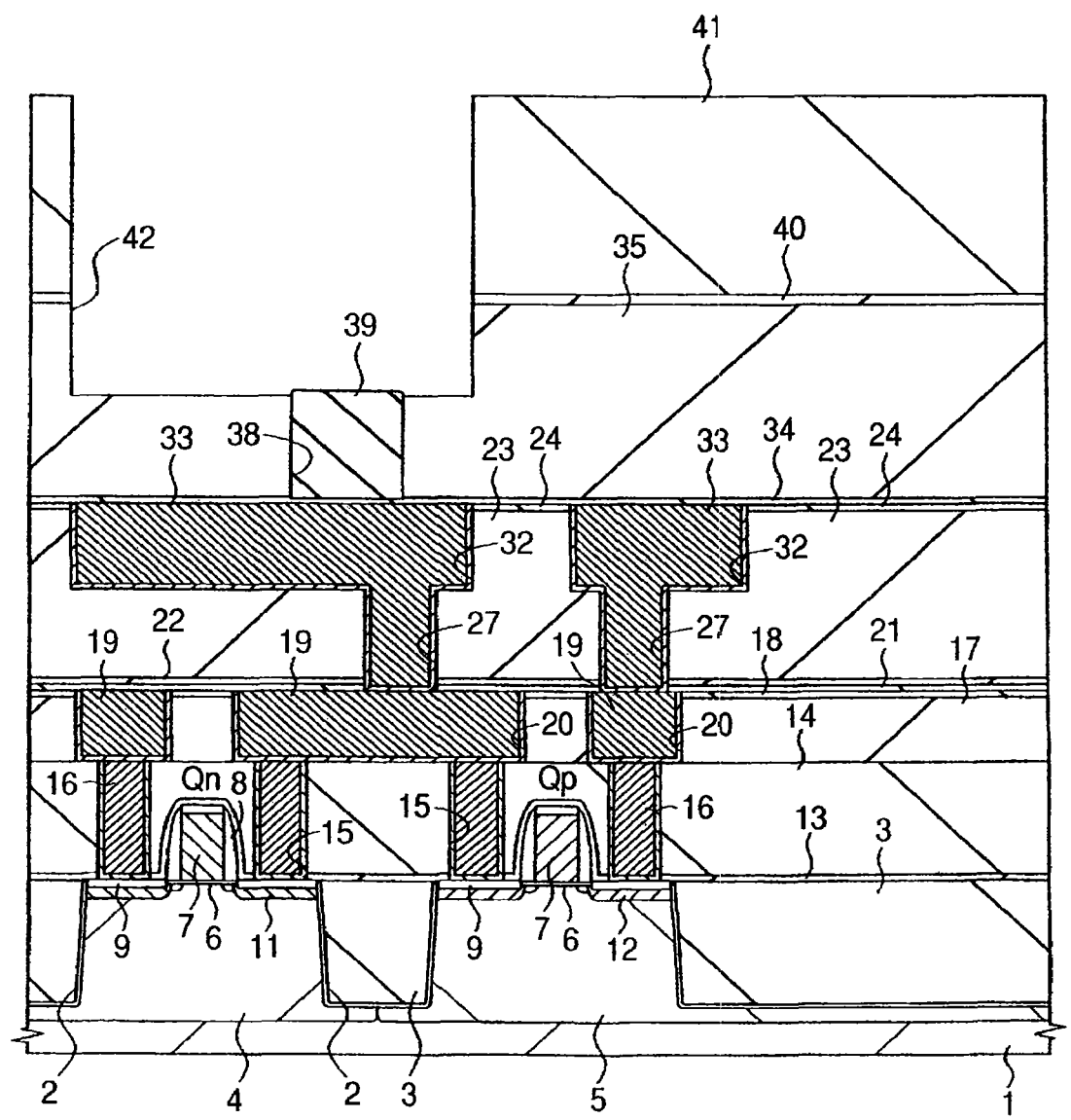
FIG. 13 is a fragmentary cross-sectional view of a semiconductor substrate illustrating a manufacturing step of a semiconductor integrated circuit device following that of FIG. 12.

As illustrated in FIG. 13, an interconnect trench 42 is formed in the interlayer insulating film 35. The interconnect trench 35 is formed by forming an antireflective film 40 over the interlayer insulating film 35, forming a photoresist film 41 over the antireflective film 40, dry etching the antireflective film 40 with the photoresist film 41 as a mask and then, dry etching the interlayer insulating film 35 while leaving a lower portion thereof without etching. In this Embodiment, the interconnect trench 42 is formed by time-controlled etching similar to that employed for the formation for the interconnect trench 32.

Figure 14:
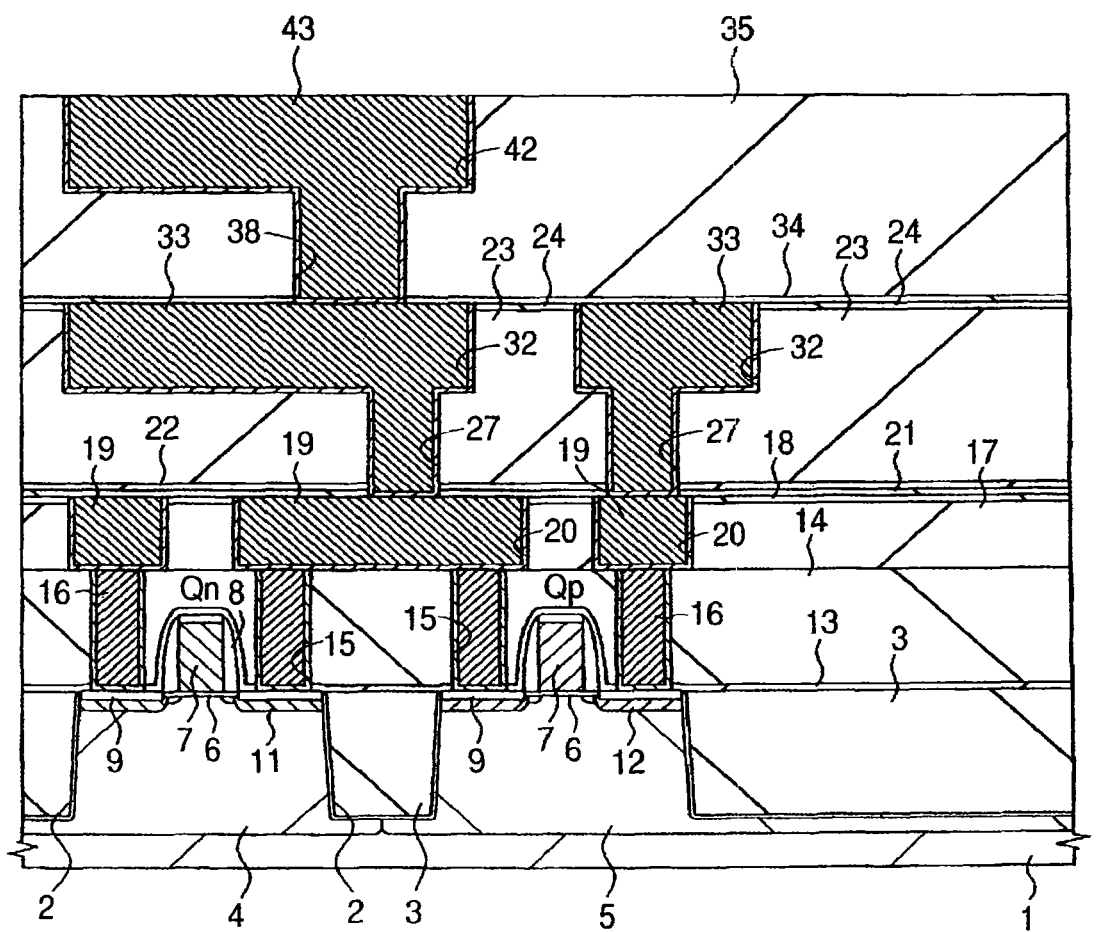
FIG. 14 is a fragmentary cross-sectional view of a semiconductor substrate illustrating a manufacturing step of a semiconductor integrated circuit device following that of FIG. 13.

As illustrated in FIG. 14, a third-level interconnect 43 is formed in the interconnect trench 42 and via hole 38. The third-level interconnect 43 is formed by removing the photoresist film 41 and then removing the antireflective film 40 by dry etching. The antireflective film 40 is removed by removing the filler 39 filled in the via hole 38 and the underlying barrier insulating film 34 to expose the surface of the second-level interconnect 33 from the bottom of the via hole 38. Over the interlayer insulating film 35 including the inside of the interconnect trench 42 and via hole 38, a thin TiN film (barrier metal film) is deposited by sputtering. After deposition of a thick Cu film over the TiN film by sputtering or plating, the Cu film and barrier metal film outside the interconnect trench 42 are removed by chemical mechanical polishing.

Figure 15:
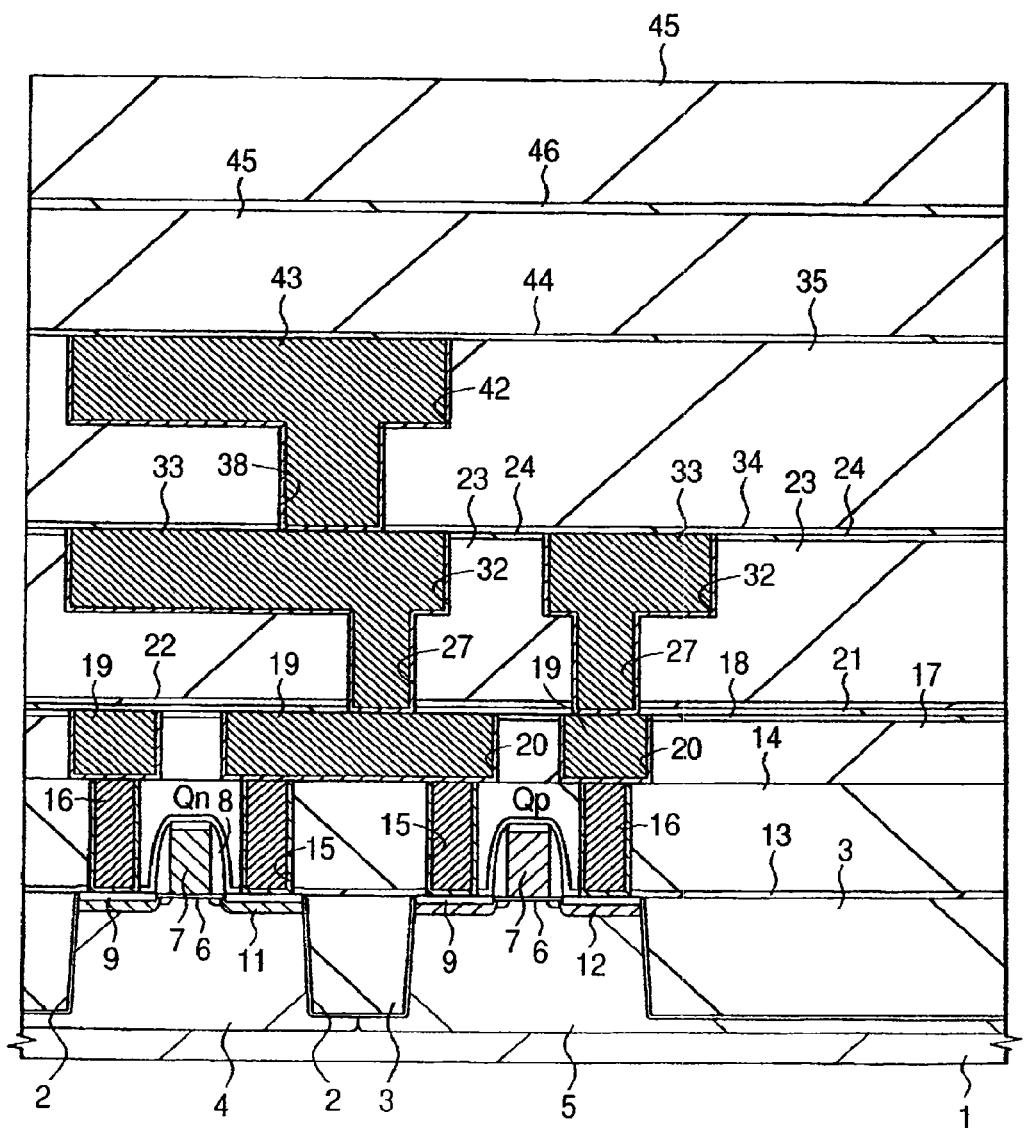
FIG. 15 is a fragmentary cross-sectional view of a semiconductor substrate illustrating a manufacturing step of a semiconductor integrated circuit device following that of FIG. 14.

As illustrated in FIG. 15, a barrier insulating film 44 and an interlayer insulating film 45 are deposited over the third-level interconnect 43. The barrier insulating film 44 is an insulating film for preventing diffusion of Cu and similar to the underlying barrier insulating films 34 and 21, it is made of an SiCN film of about from 50 nm to 100 nm deposited by the plasma CVD. In a fourth-level interconnect to be formed in the interlayer insulating film 45 in the subsequent step, the size of each interconnect, distance between interconnects and thickness of each interconnect are greater than those of the lower-level interconnects. The interlayer insulating film 45 is therefore made of a silicon oxide film of about 1 μm thick deposited by CVD. An SiCO film may be formed between the barrier insulating film 44 and interlayer insulating film 45 for the purpose of improving the adhesion therebetween. As a silicon oxide series material constituting the interlayer insulating film 45, silicon oxide added with F to reduce its dielectric constant may be used.

When an interconnect trench is formed by etching the interlayer insulating film 45 while leaving a lower portion thereof without etching, the interlayer insulating film 45 having a great thickness makes it difficult to control the depth of the interconnect trench with high precision. Described specifically, the interconnect trenches 52 and 53 are deeper than the above-described interconnect trenches 32 and 42 so that they cannot be formed easily by time-controlled etching employed for the formation of the interconnect trenches 32 and 43. The depth of the interconnect trench is therefore controlled by forming, in the interlayer insulating film 45, a stopper film 46 having an etch selectivity different from that of the interlayer insulating film 45 and stopping etching at the surface of the stopper film 46. In this Embodiment, an SiCN film of from about 10 nm to 100 nm thick deposited by plasma CVD is used as the stopper film 46 formed in the interlayer insulting film 45. The SiCN film has a high etch selectivity relative to a silicon oxide film and has a low dielectric constant so that it is useful as the stopper film 46. It also has a lower optical reflectance (has a smaller refractive index) than that of the interlayer insulating film 45 so that it also functions as an antireflective film as will be described later.

Figure 16:
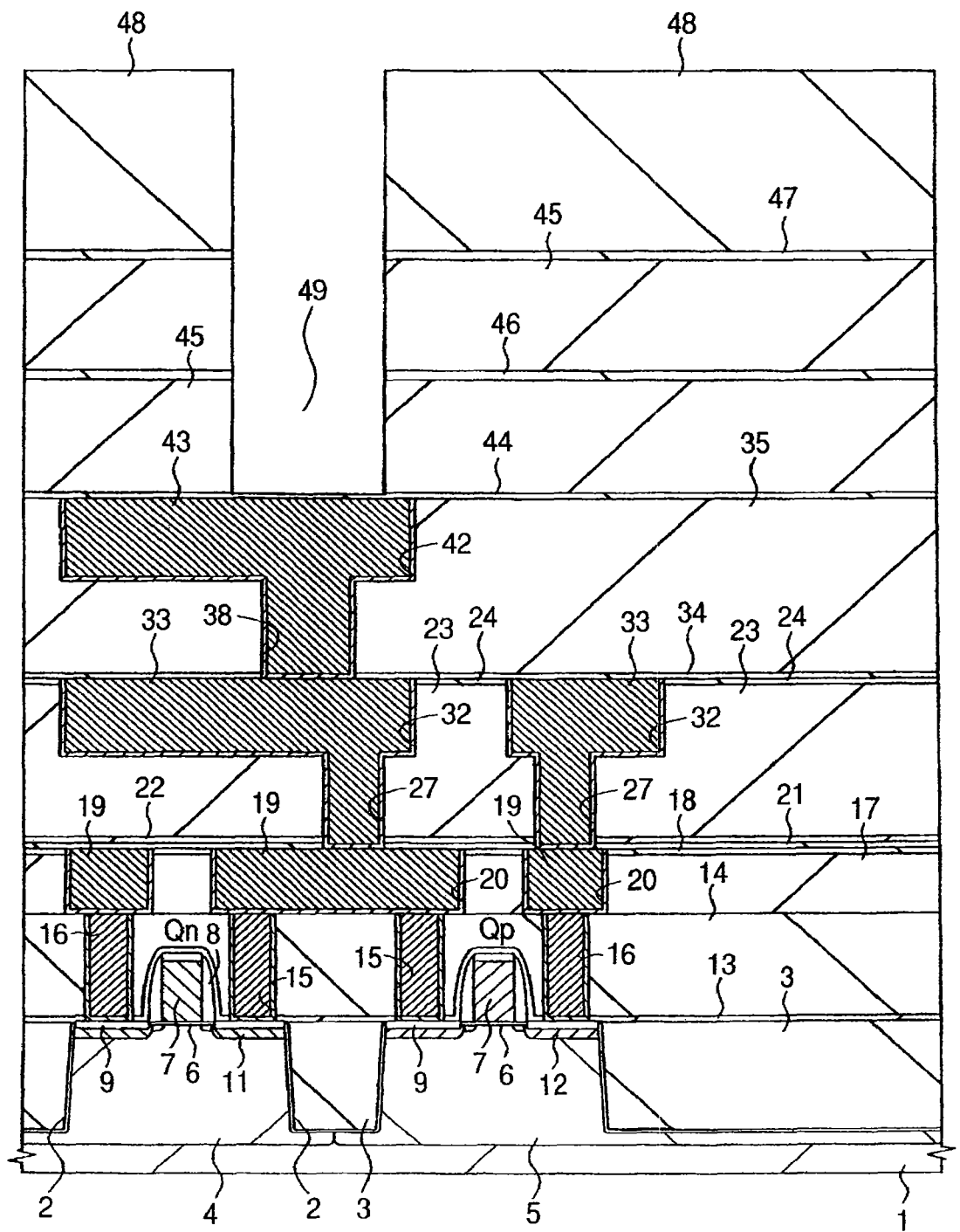
FIG. 16 is a fragmentary cross-sectional view of a semiconductor substrate illustrating a manufacturing step of a semiconductor integrated circuit device following that of FIG. 15.

As illustrated in FIG. 16, after formation of an antireflective film 47 over the interlayer insulating film 45, the antireflective film 47, interlayer insulating film 45, stopper film 46 and interlayer insulating film 45 are dry-etched successively with the photoresist film 48 formed over the antireflective film 47 as a mask, whereby a via hole 38 is formed over the third-level interconnect 43.

Figure 17:
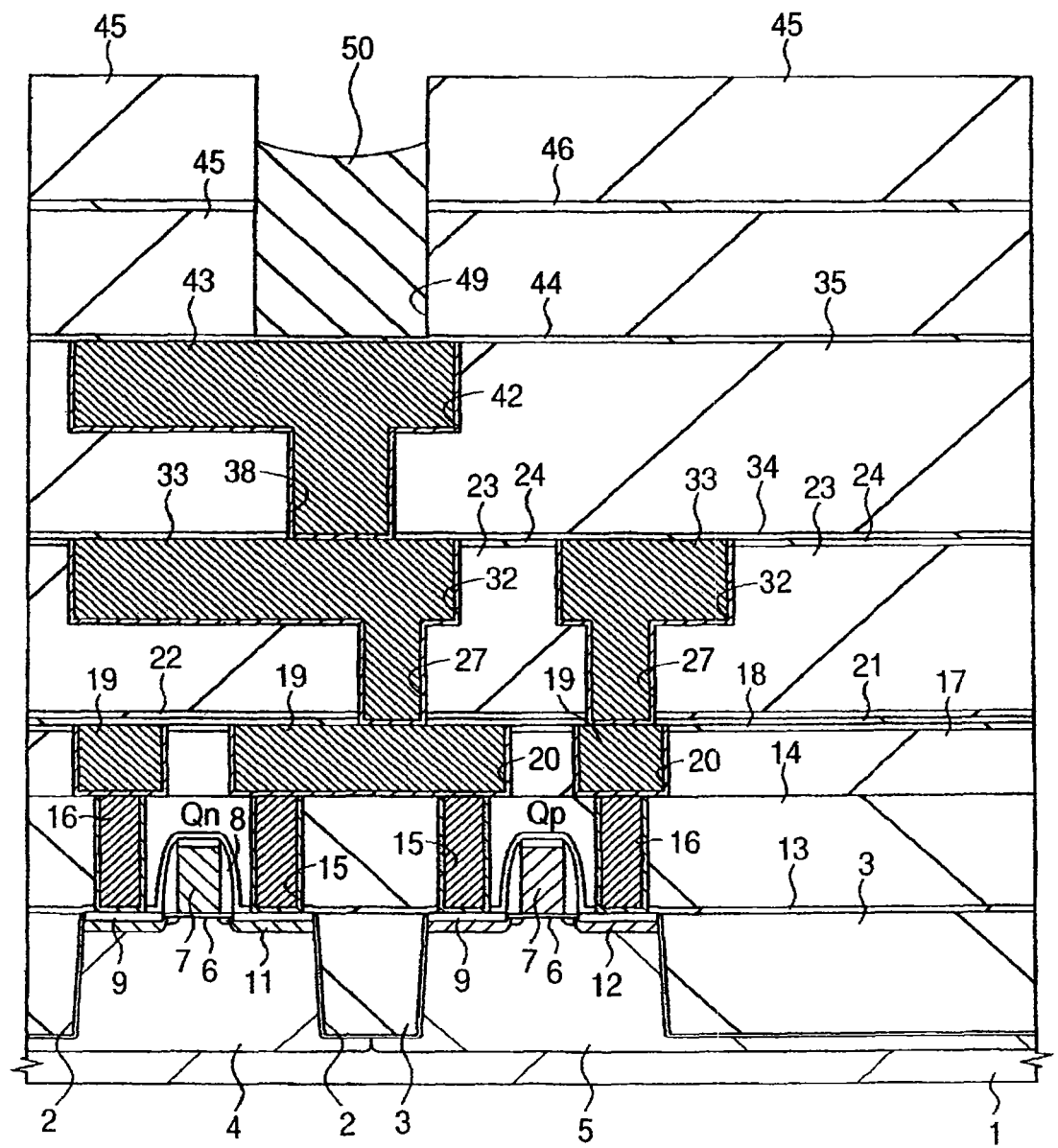
FIG. 17 is a fragmentary cross-sectional view of a semiconductor substrate illustrating a manufacturing step of a semiconductor integrated circuit device following that of FIG. 16.

After removal of the photoresist film 48 and antireflective film 47, a filler 50 is filled in the via hole 49 as illustrated in FIG. 17. The material and filling method of the filler 50 are similar to those described above. The via hole 49 for the formation of a fourth-level interconnect has larger diameter and depth than the underlying via holes 38 and 27, which prevents complete filling of the filler 50. Accordingly, the filler 50 filled in the via hole 49 does not have a flat surface and it inevitably has a step difference with the surface of the interlayer insulating film 45.

Figure 18:
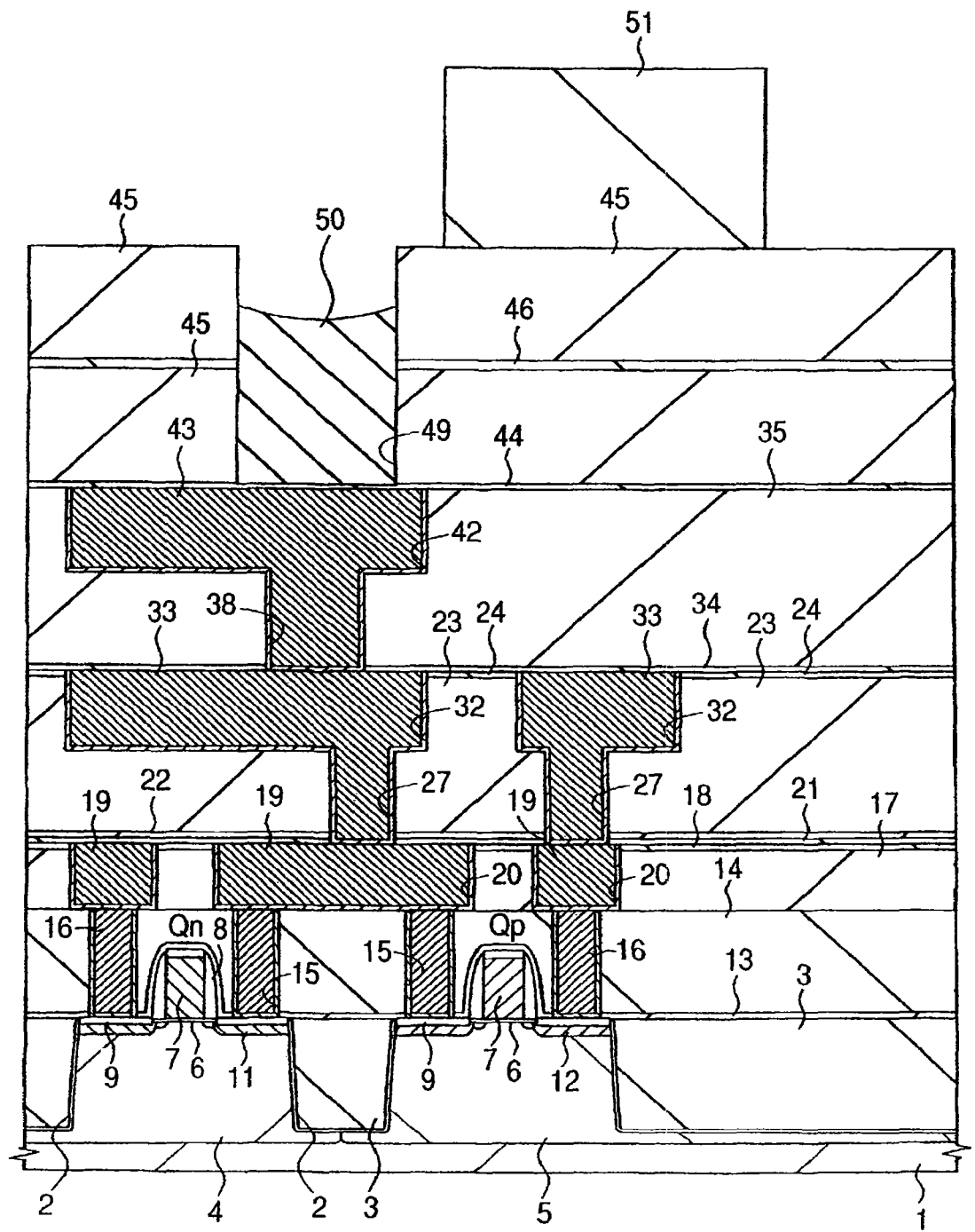
FIG. 18 is a fragmentary cross-sectional view of a semiconductor substrate illustrating a manufacturing step of a semiconductor integrated circuit device following that of FIG. 17.

As illustrated in FIG. 18, a photoresist film 51 is formed over the interlayer insulating film 45. As described above, the filler 50 filled in the via hole 49 does not have a flat surface and has a step difference with the surface of the interlayer insulating film 45 so that it is difficult to apply a uniformly thick antireflective film over the entire surface of the interlayer insulating film 45. Accordingly, a photoresist film 51 is directly formed over the interlayer insulating film 45 without using the antireflective film.

The photoresist film 51 is a film to which a pattern having an interconnect trench formation region and a fuse formation region opened therein has been transferred by the exposure through a photomask (not illustrated) having an interconnect trench pattern and a fuse pattern formed therein and then development. As described above, since the stopper film 46 made of an SiCN film having a low optical reflectance is formed in the interlayer insulating film 45, it is possible to prevent the inconvenience such as deterioration of resolution, which will otherwise occur by the exposure light reflecting from the surface of the third-level interconnect 43 and incident on the photoresist film 51, without forming an antireflective film below the photoresist film 51. A step of forming an antireflective film below the photoresist film 51 is therefore unnecessary, leading to a simplification of the manufacturing process. The stopper film 46 formed in the interlayer insulating film 45 is required to have an etch selectivity different from that of a silicon oxide film, a low optical reflectance and a low dielectric constant. Examples of such an insulating material include, in addition to the above-described SiCN, silicon nitride (SiN) and silicon oxynitride (SiON). Of these, SiCN is most preferred.

Figure 19:
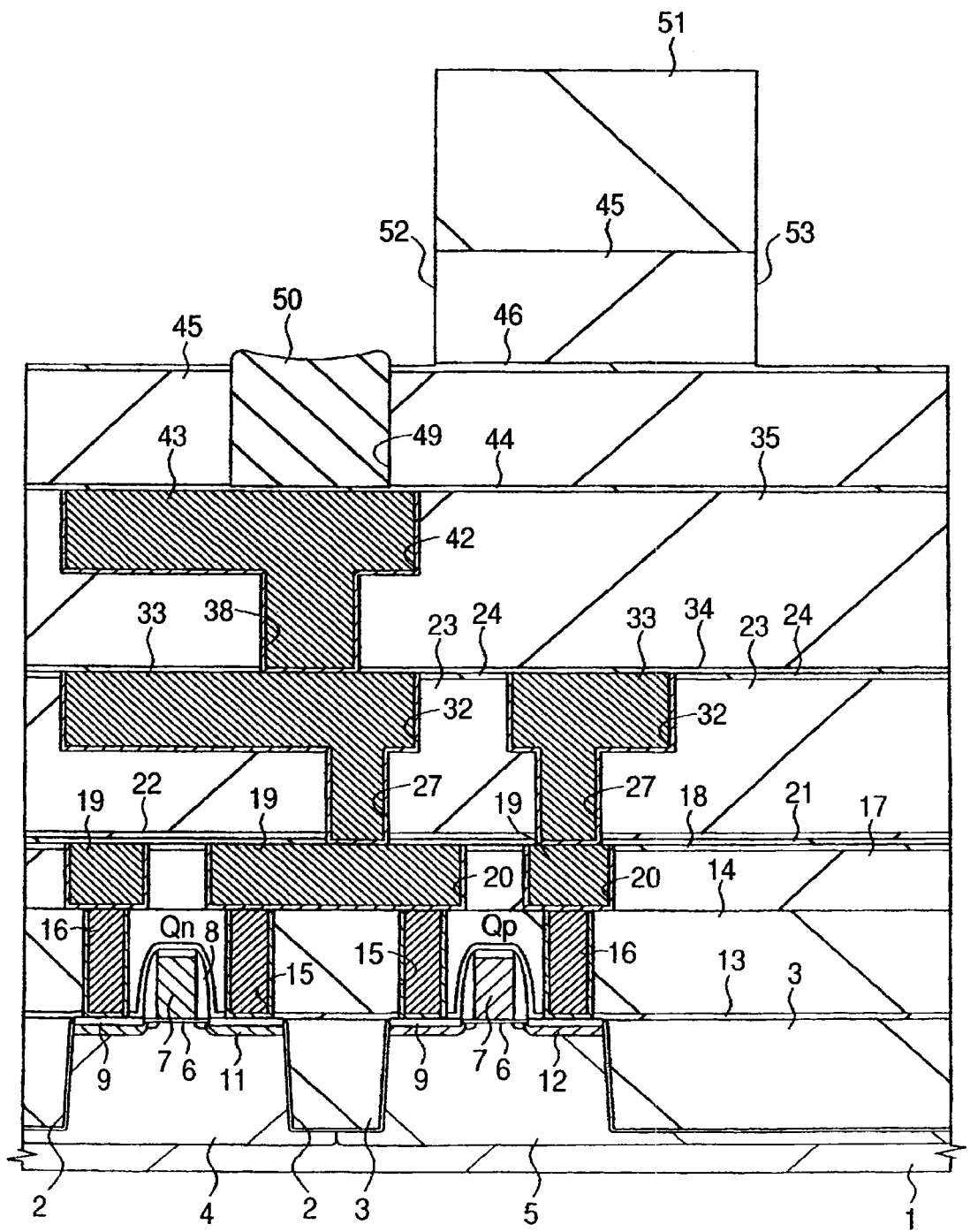
FIG. 19 is a fragmentary cross-sectional view of a semiconductor substrate illustrating a manufacturing step of a semiconductor integrated circuit device following that of FIG. 18.

As illustrated in FIG. 19, with the photoresist film 51 as a mask, the interlayer insulating film 45 is dry etched and etching is stopped at the surface of the stopper film 46, whereby interconnect trenches 52 and 53 are formed in the interlayer insulating film 45 over the stopper film 46.

Figure 20:
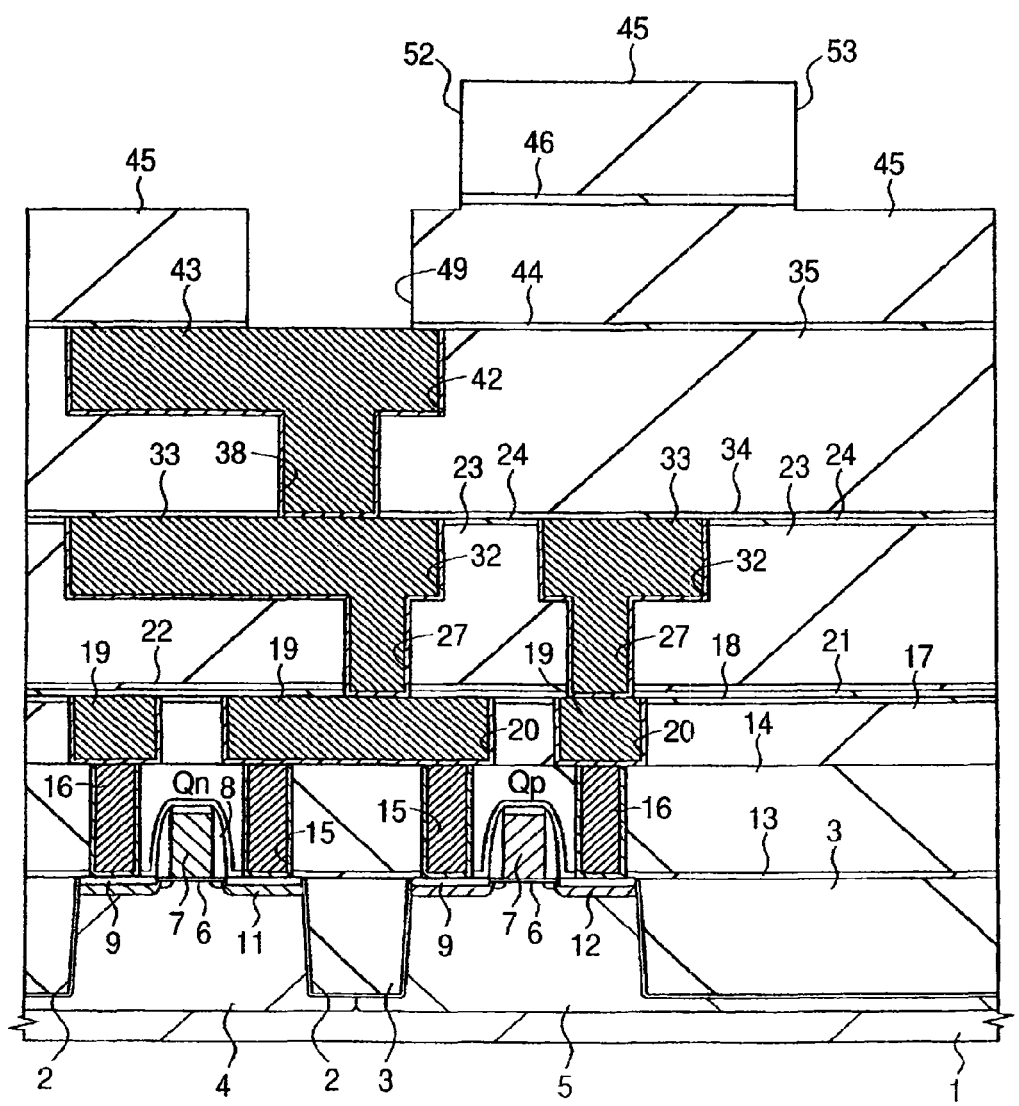
FIG. 20 is a fragmentary cross-sectional view of a semiconductor substrate illustrating a manufacturing step of a semiconductor integrated circuit device following that of FIG. 19.

After removal of the photoresist film 51, the filler 50 filled in the via hole 49 is removed by dry etching to expose the surface of the third-level interconnect 43 from the bottom of the via hole 49 as illustrated in FIG. 20.

Figure 21:
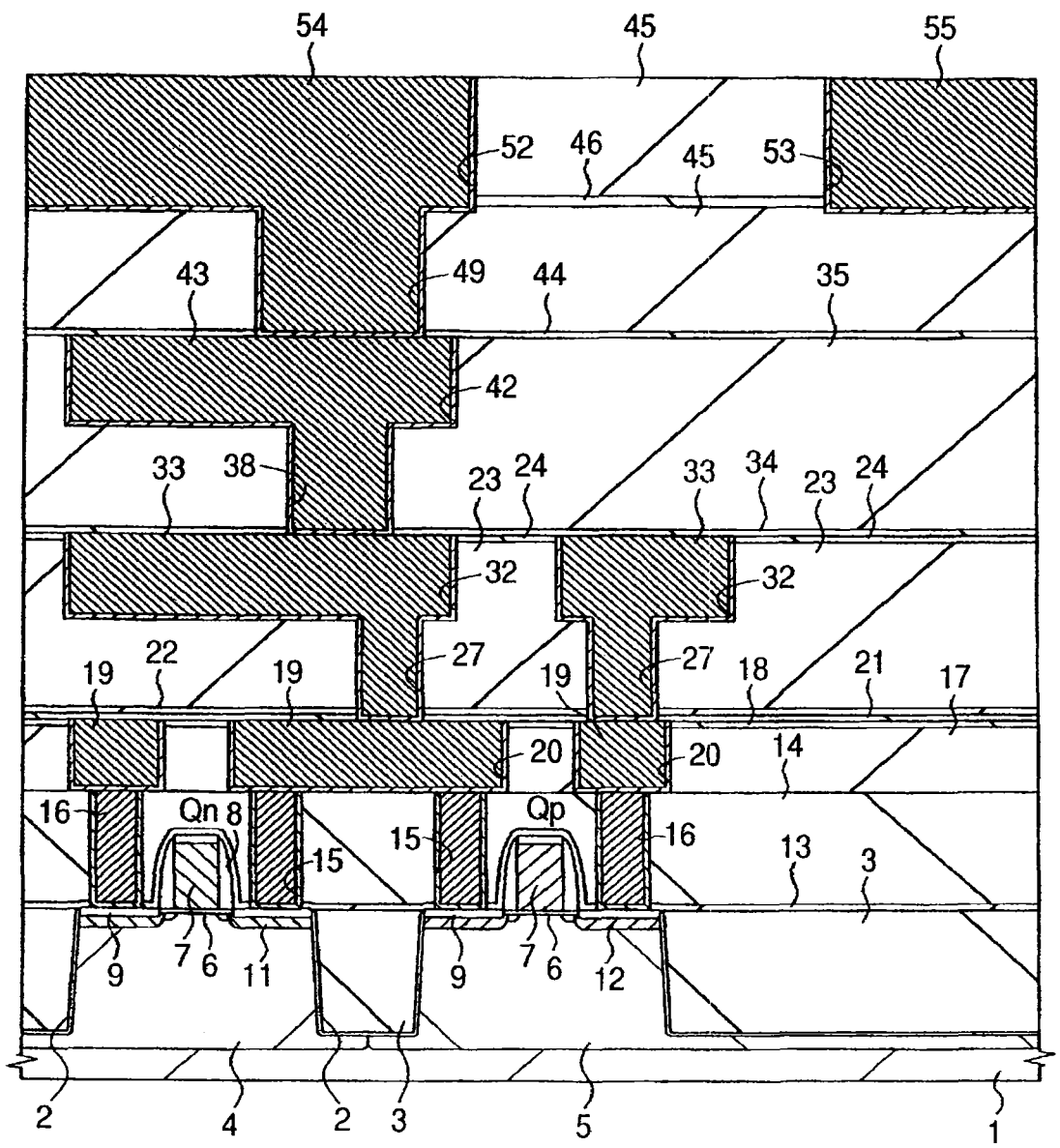
FIG. 21 is a fragmentary cross-sectional view of a semiconductor substrate illustrating a manufacturing step of a semiconductor integrated circuit device following that of FIG. 20.

As illustrated in FIG. 21, a fourth-level interconnect 54 is formed inside of the interconnect trench 52 and via hole 49, while the fourth-level interconnect 54 which will be a fuse 55 is formed inside of the interconnect trench 53. Although not illustrated in this drawing, the fuse 55 is connected to a resistor via a lower-level interconnect. The resistor is formed by the polycrystalline silicon film constituting the layer of the gate electrode 7 of the MISFETs (Qn and Qp). When a probe test, which will be described later, finds some defects in a portion of a CMOS memory, the fuse 55 is cut by using a laser beam or the like to change a resistance of the resistor and a redundant memory is replaced for the defective memory.

The fourth-level interconnect 54 and fuse 55 are formed by depositing a thin TiN film (barrier metal film) over the interlayer insulating film 45 including the insides of the interconnect trenches 52 and 53, and via hole 49 by sputtering, depositing a thick Cu film over the TiN film by sputtering or plating and then removing the Cu film and barrier metal film outside the interconnect trenches 52 and 53 by chemical mechanical polishing.

The etching stopper film 46 remains in the interlayer insulating film 45, but the distance between two adjacent interconnects is greater in the four-level interconnect than that in the underlying first-level, second-level or third-level interconnect and the interlayer insulating film 45 has a greater film thickness so that an increase in the capacitance between interconnects and capacitance between interconnect layers can be neglected substantially.

Figure 22:
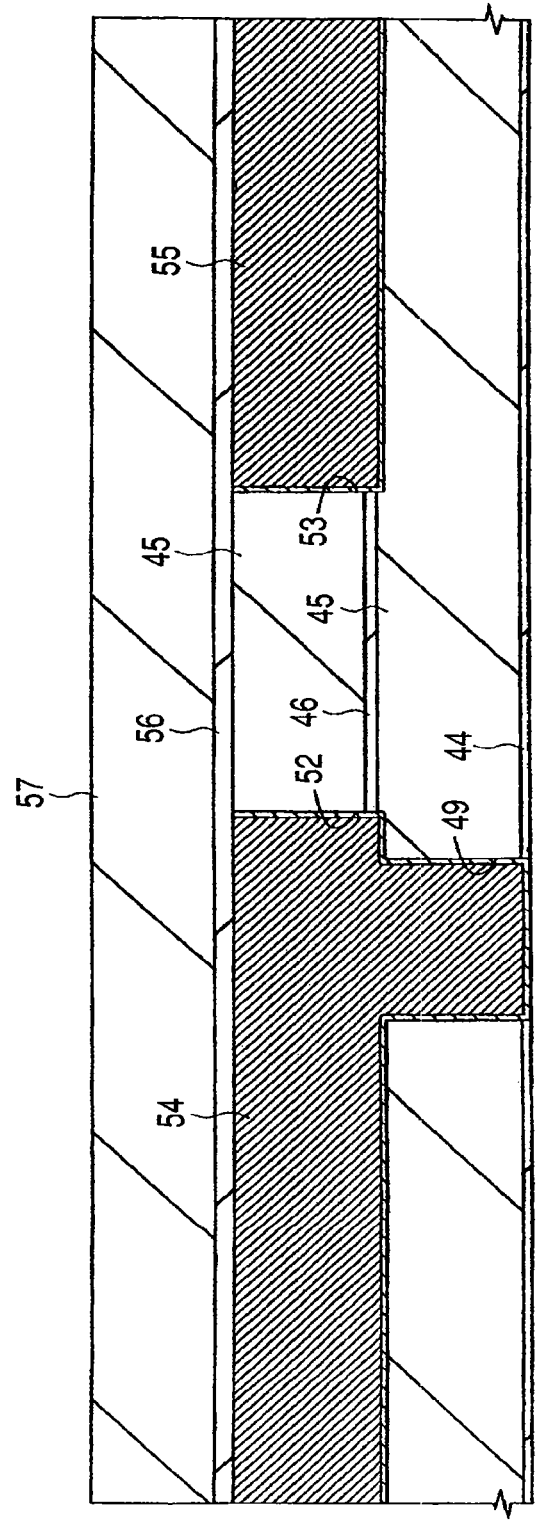
FIG. 22 is a fragmentary cross-sectional view of a semiconductor substrate illustrating a manufacturing step of a semiconductor integrated circuit device following that of FIG. 21.

As illustrated in FIG. 22, a barrier insulating film 56 and an interlayer insulating film 57 are deposited over the fourth-level interconnect 54 and fuse 55. The barrier insulating film 56 is an insulating film for preventing the diffusion of Cu and similar to the underlying barrier insulating films 44, 34 and 21, it is made of an SiCN film deposited by plasma CVD. The interlayer insulating film 57 is, similar to the underlying interlayer insulating films 45 and 32, made of a silicon oxide series insulating film having a thickness of about 900 nm. In FIG. 22 and the drawings after FIG. 22, portions lying below the fourth-level interconnect 54 are omitted.

As described later, an interlayer insulating film and surface protective film are formed over the fourth-level interconnect 54 and fuse 55. In the interlayer insulating film and surface protective film over the fuse 55, an opening for exposing the fuse 55 to laser beam is formed. If water enters from outside into the circuit via this opening, the fuse 55 may presumably be corroded. In this Embodiment 1, the thickness of the barrier insulating film 56 (for example, from about 150 nm to 200 nm) is made greater than that of the underlying barrier insulating films 44, 34 and 21 to improve the moisture resistance of the fuse 55.

Figure 23:
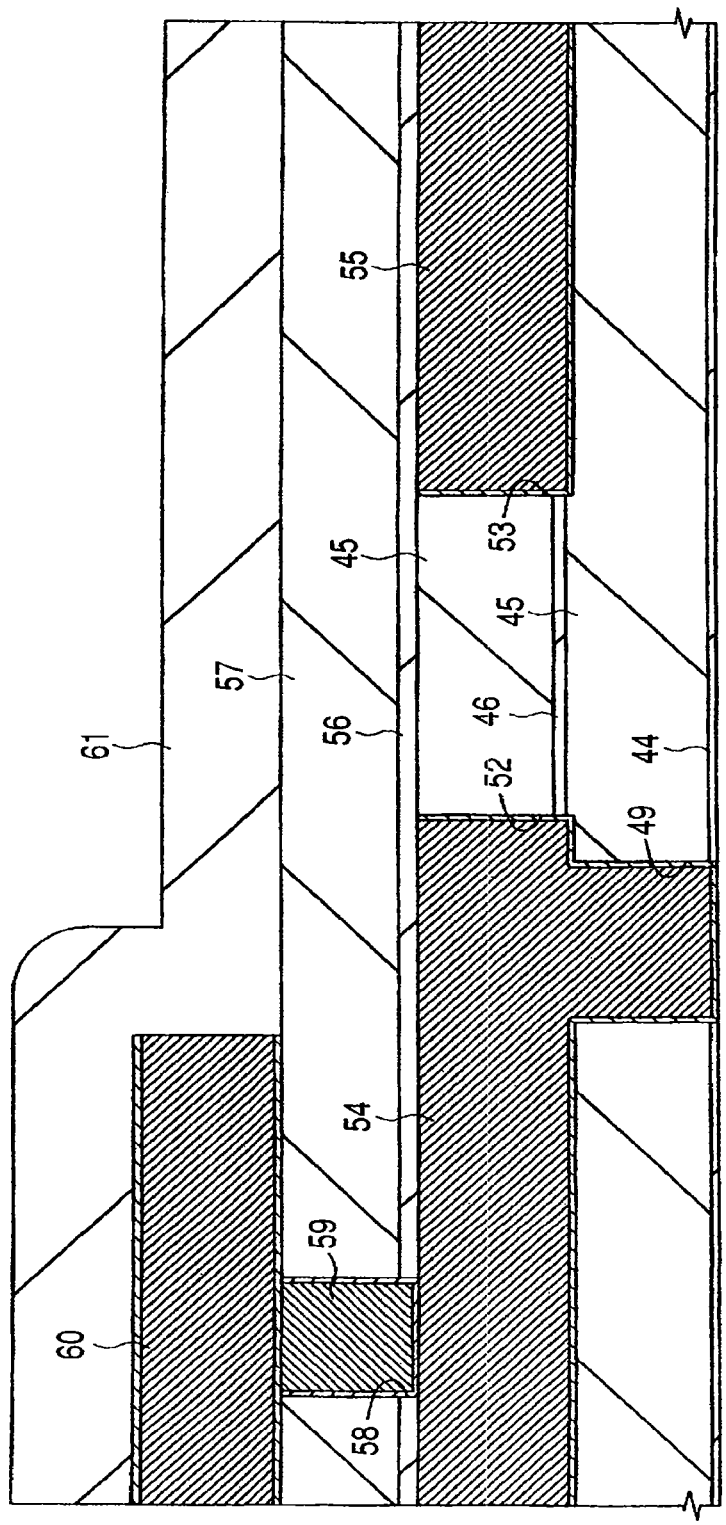
FIG. 23 is a fragmentary cross-sectional view of a semiconductor substrate illustrating a manufacturing step of a semiconductor integrated circuit device following that of FIG. 22.

As illustrated in FIG. 23, an uppermost-level interconnect (fifth-level interconnect) 60 is formed over the interlayer insulating film 57, followed by the formation of a surface protective film 61 over the uppermost-level interconnect 60. The uppermost-level interconnect 60 is formed in the following manner. With a photoresist film as a mask, the interlayer insulating film 57 over the fourth-level interconnect 54 is dry etched and then, the barrier insulating film 56 which lie below the interlayer insulating film 57 is dry etched to form a through-hole 58. A plug 59 is formed inside of the through-hole 58. The plug 59 is, similar to the plug 16 of the lower layer, made of a film stack of a TiN film and W film. Over the interlayer insulating film 57, a TiN of from about 50 nm to 100 nm, an Al (aluminum) alloy film of about 1 μm thick and a TiN film of from about 50 nm to 100 nm thick is deposited by sputtering. With a photoresist film (not illustrated) as a mask, these conductive films are etched to form the uppermost-level interconnect 60. The surface protective film 61 over the uppermost-level interconnect 60 is made of a film stack of a silicon oxide film of about 200 nm thick and a silicon nitride film of about 600 nm thick deposited by plasma CVD.

Figure 24:
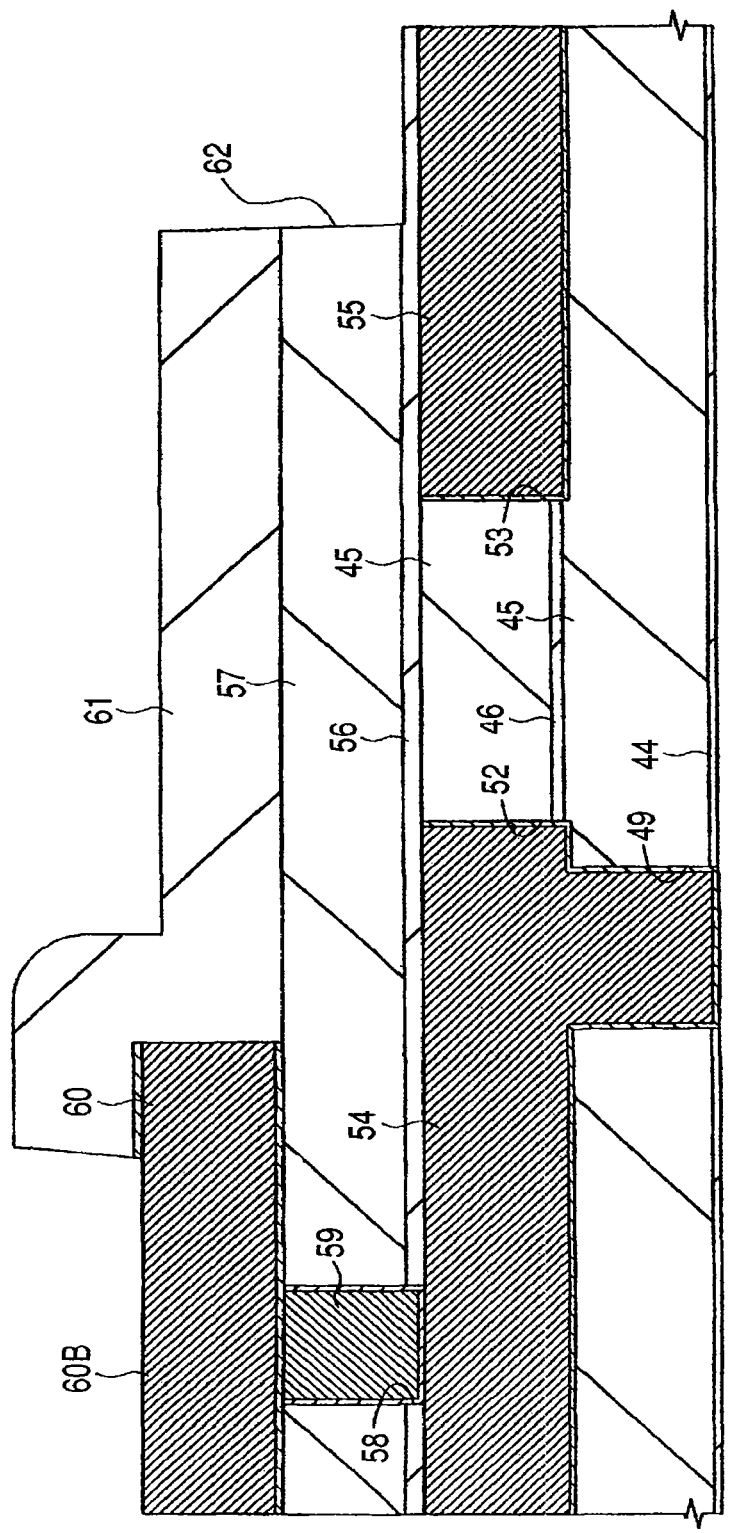
FIG. 24 is a fragmentary cross-sectional view of a semiconductor substrate illustrating a manufacturing step of a semiconductor integrated circuit device following that of FIG. 23.

As illustrated in FIG. 24, with a photoresist film (not illustrated) as a mask, the surface protective film 61 is dry etched to expose a portion of the uppermost-level interconnect 60, whereby a bonding pad 60B is formed. The surface protective film 61 and interlayer insulating film 57 over the fuse 55 are dry etched to form an opening 62. During the formation of this opening, the barrier insulating film 55 is left over the fuse 55 by terminating the etching at the surface of the barrier insulating film 56 which covers therewith the fuse 55.

Since the barrier insulating film 55 over the fuse 55 is thicker than the underlying barrier insulating film 44, 34 or 21, the moisture resistance can be maintained. Described specifically, supposing that the thickness of the barrier insulating film 56 is equal to that of the barrier insulating film 44, 34 or 21, the barrier insulating film becomes thin further, for example, by the etching step for the formation of the opening 62 over the fuse 55, oxygen plasma ashing step for the removal of the photoresist film, washing step or the like step, which disadvantageously leads to lowering in moisture resistance. Particularly in etching of the opening 62, a film thicker than the underlying interlayer insulating film must be etched so that there is a fear of the barrier insulating film 56 becoming excessively thin by overetching. It is therefore necessary to form the barrier insulating film 56 with a thickness greater than that of the underlying barrier insulating film 44, 34 or 21.

An electrical test of the circuit (probe test) is carried out while applying a probe (not illustrated) onto the surface of the bonding pad 60B. When the probe test reveals the existence of a defect in a portion of the semiconductor device, the fuse 55 is exposed to a laser beam via the opening 62 to cut the fuse 55, whereby the defective memory is substituted by a redundant memory.

The insulating film left over the fuse 55 has an enough thickness to be cut by exposure to a laser beam which will be described later. The insulating film 57 may be left as needed.

Figure 25:
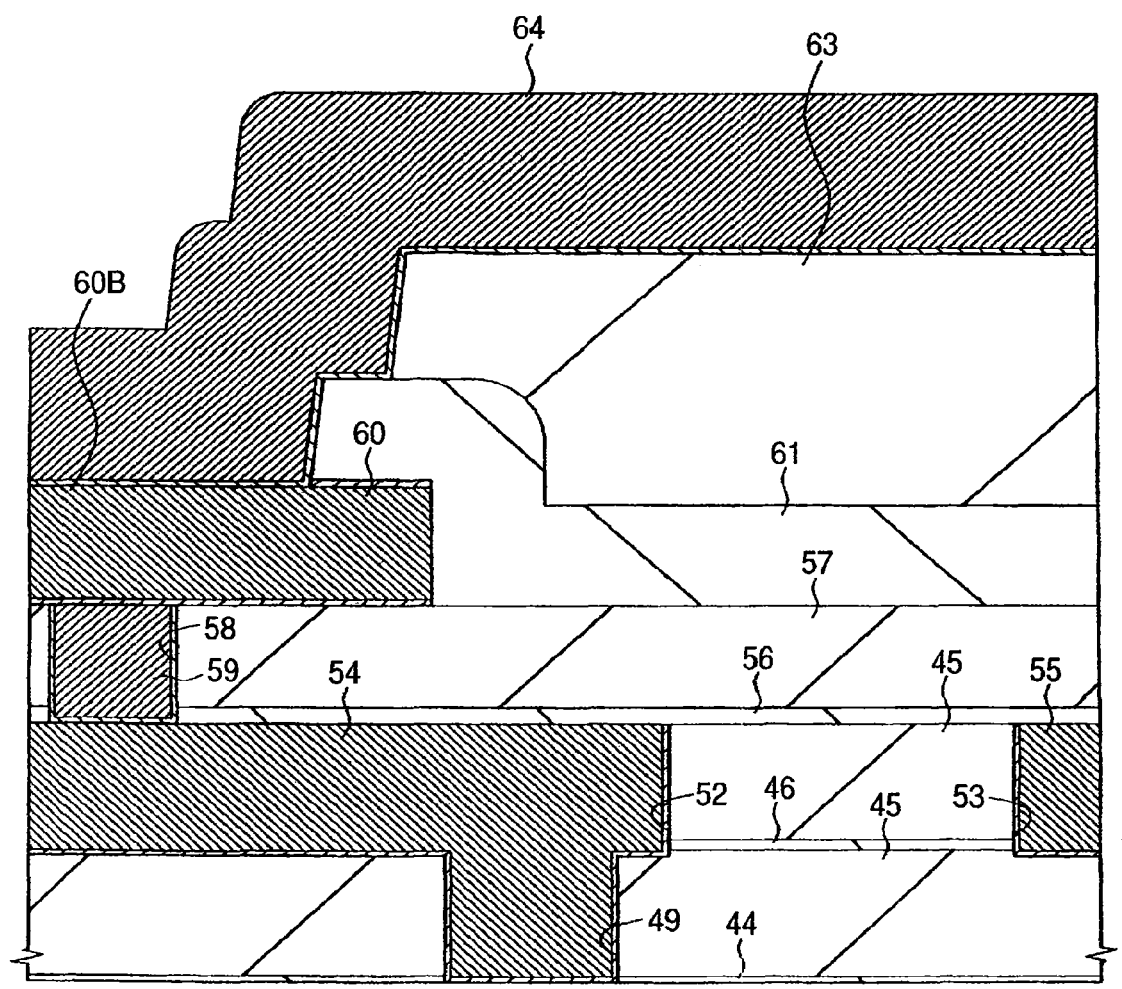
FIG. 25 is a fragmentary cross-sectional view of a semiconductor substrate illustrating a manufacturing step of a semiconductor integrated circuit device following that of FIG. 24.

As illustrated in FIG. 25, after deposition of a polyimide resin film 63 over the surface protective film 61, a leading-out interconnect 64 is formed over the polyimide resin film 63, whereby the bonding pad 60B and leading-out interconnect 64 are electrically connected. This leading-out interconnect 64 is an interconnect for electrically connecting a solder bump constituting an external connection terminal of a CMOS memory to the bonding pad 60B. The leading-out interconnect 64 is formed by depositing the polyimide resin film 63 over the surface protective film 61, and etching the polyimide resin film 63 over the bonding pad 60B with a photoresist film (not illustrated) as a mask to expose the surface of the bonding pad 60B. Then, after formation of a photoresist film (not illustrated) having the formation region of the leading-out interconnect 64 opened therein over the surface protective film 61, a Cu film is deposited over the surface protective film 61 by plating or sputtering.

Figure 26:
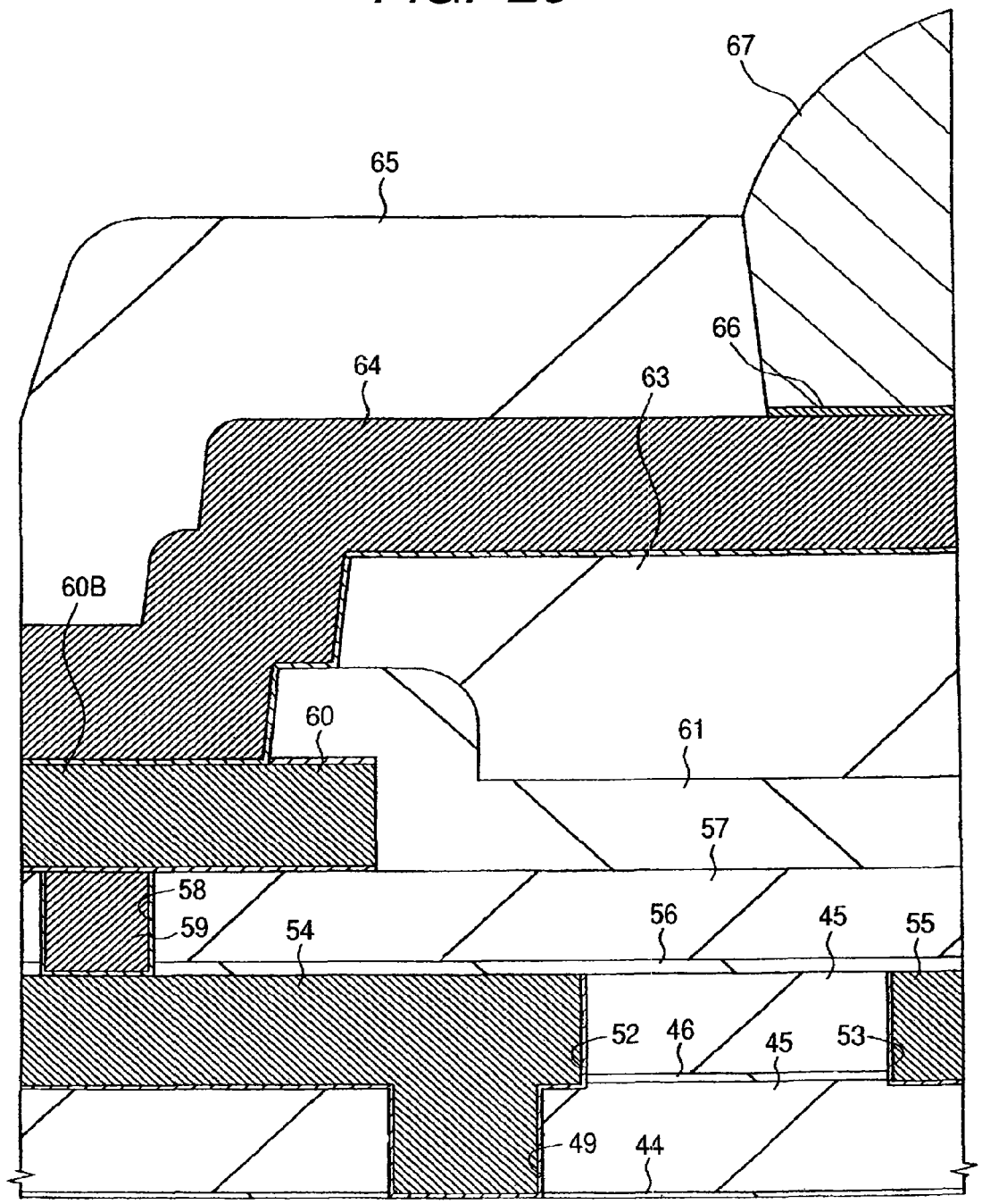
FIG. 26 is a fragmentary cross-sectional view of a semiconductor substrate illustrating a manufacturing step of a semiconductor integrated circuit device following that of FIG. 25.

As illustrated in FIG. 26, the surface of the leading-out interconnect 64 made of the Cu film is covered with a polyimide resin film 65 and then, a portion of the polyimide resin film 65 is etched to expose one end of the leading-out interconnect 64. An Au (gold) film 66 is formed on the surface thereof by plating. A solder bump 67 is then formed on the surface of the Au (gold) film 66 by the printing method, whereby the external connection terminal of the semiconductor integrated circuit device is formed.

During the formation step of the leading-out interconnect 64, the barrier insulating film 56 over the fuse 55 is thinned by etching or ashing of the photoresist film, but it is possible to prevent the deterioration of moisture resistance by thickening the barrier insulating film 56 in advance.

Embodiment 2

In Embodiment 1, an interconnect trench was formed after formation of a via hole in an interlayer insulating film. In this Embodiment, on the other hand, a via hole is formed after formation of an interconnect trench in an interlayer insulating film.

Figure 27:
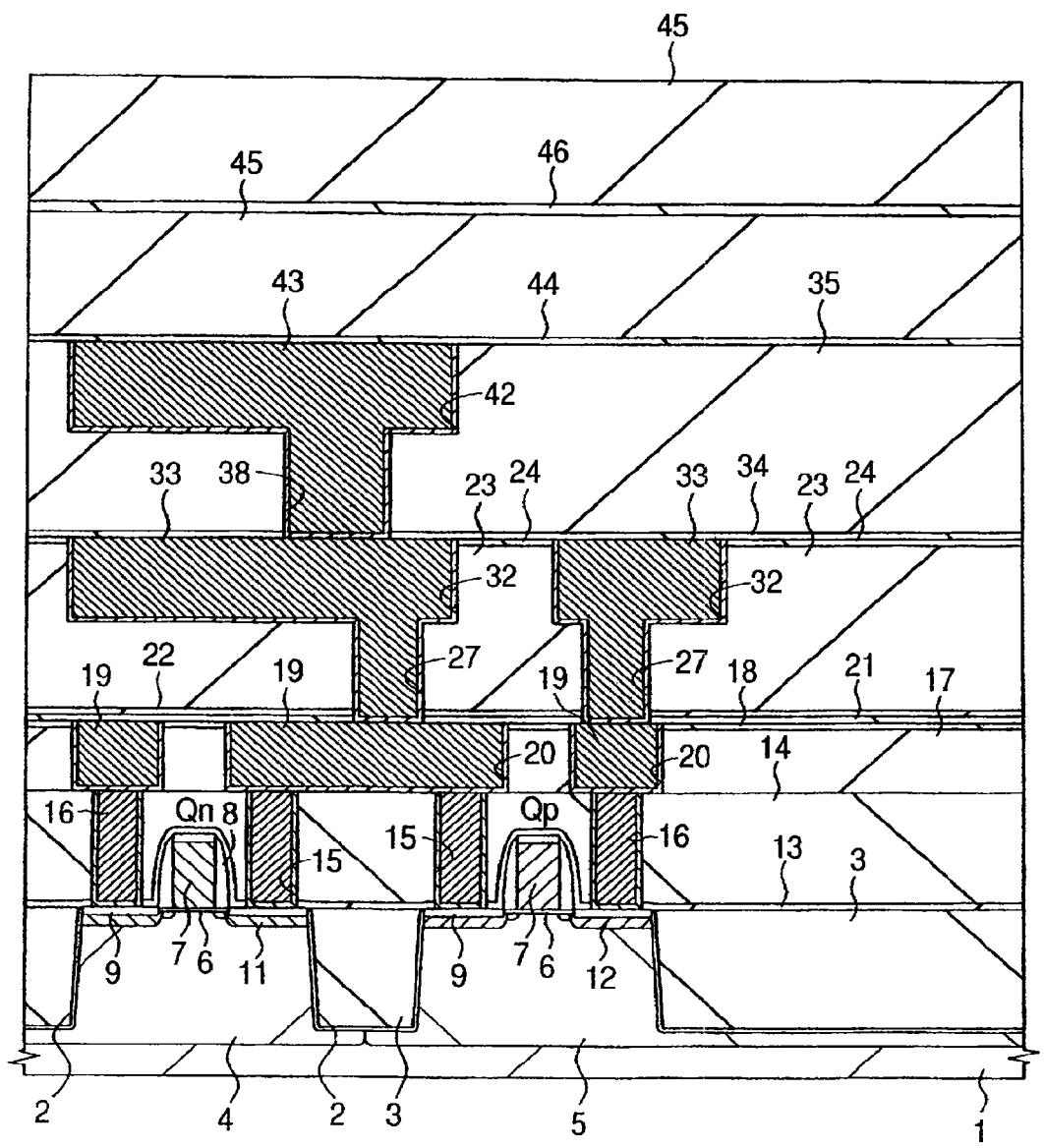
FIG. 27 is a fragmentary cross-sectional view of a semiconductor substrate illustrating a manufacturing step of a semiconductor integrated circuit device according to another embodiment of the present invention.

As illustrated in FIG. 27, a barrier insulating film 44 and an interlayer insulating film 45 are deposited over a third-level interconnect 43. A stopper film 46 is formed in the interlayer insulating film 45. An SiCN film of from about 10 nm to 100 nm thick deposited by plasma CVD is used as the stopper film 46. Steps until this step are similar to those described referring to FIGS. 1 to 15 in Embodiment 1.

Figure 28:
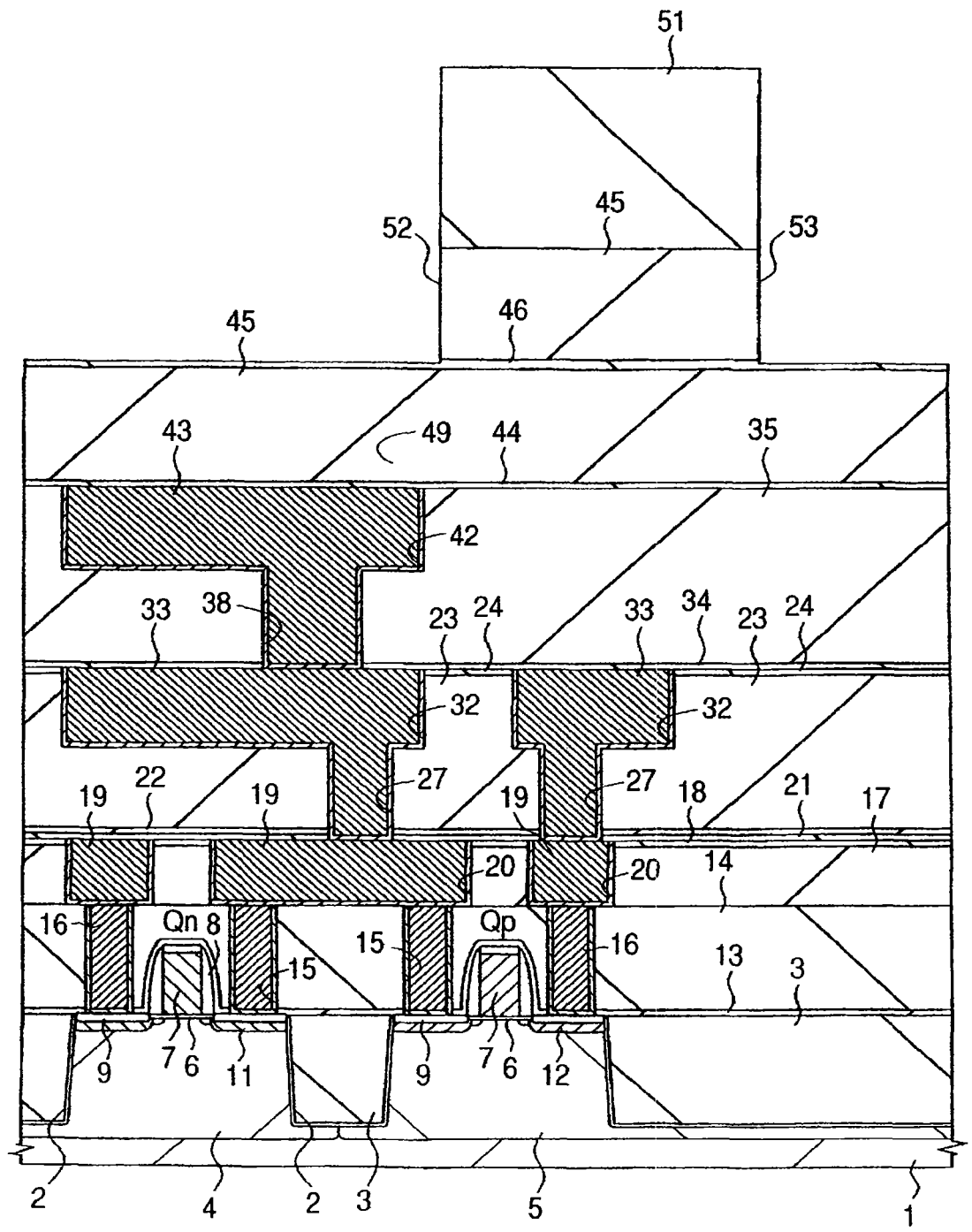
FIG. 28 is a fragmentary cross-sectional view of a semiconductor substrate illustrating a manufacturing step of a semiconductor integrated circuit device following that of FIG. 27.

As illustrated in FIG. 28, after formation of a photoresist film 51 over the interlayer insulating film 45, the interlayer insulating film 45 is dry etched with the photoresist film 51 as a mask. By stopping etching at the surface of the stopper film 46, interconnect trenches 52 and 53 are formed in the interlayer insulating film 45 over the stopper film 46. Here an antireflective film is not formed between the interlayer insulating film 45 and the photoresist film 51, but the stopper film 46 made of an SiCN film having a low optical reflectance has been formed in the interlayer insulating film 45 as in Embodiment 1. Even if an antireflective film is not formed below the photoresist film 51, lowering of resolution, which will otherwise occur by an exposure light reflecting from the surface of the third-level interconnect 43 and incident on the photoresist film 51, can be suppressed.

Figure 29:
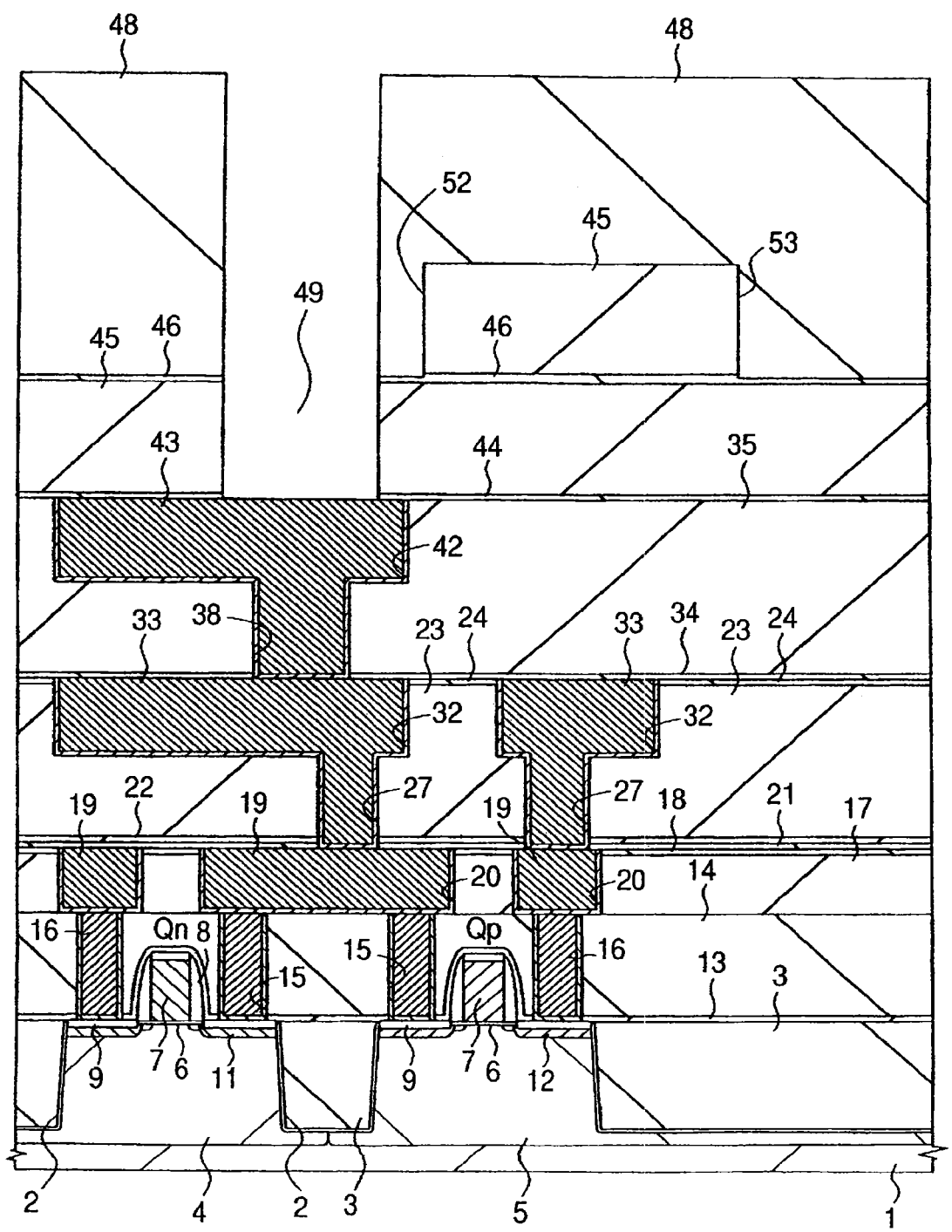
FIG. 29 is a fragmentary cross-sectional view of a semiconductor substrate illustrating a manufacturing step of a semiconductor integrated circuit device following that of FIG. 28.
Figure 30:
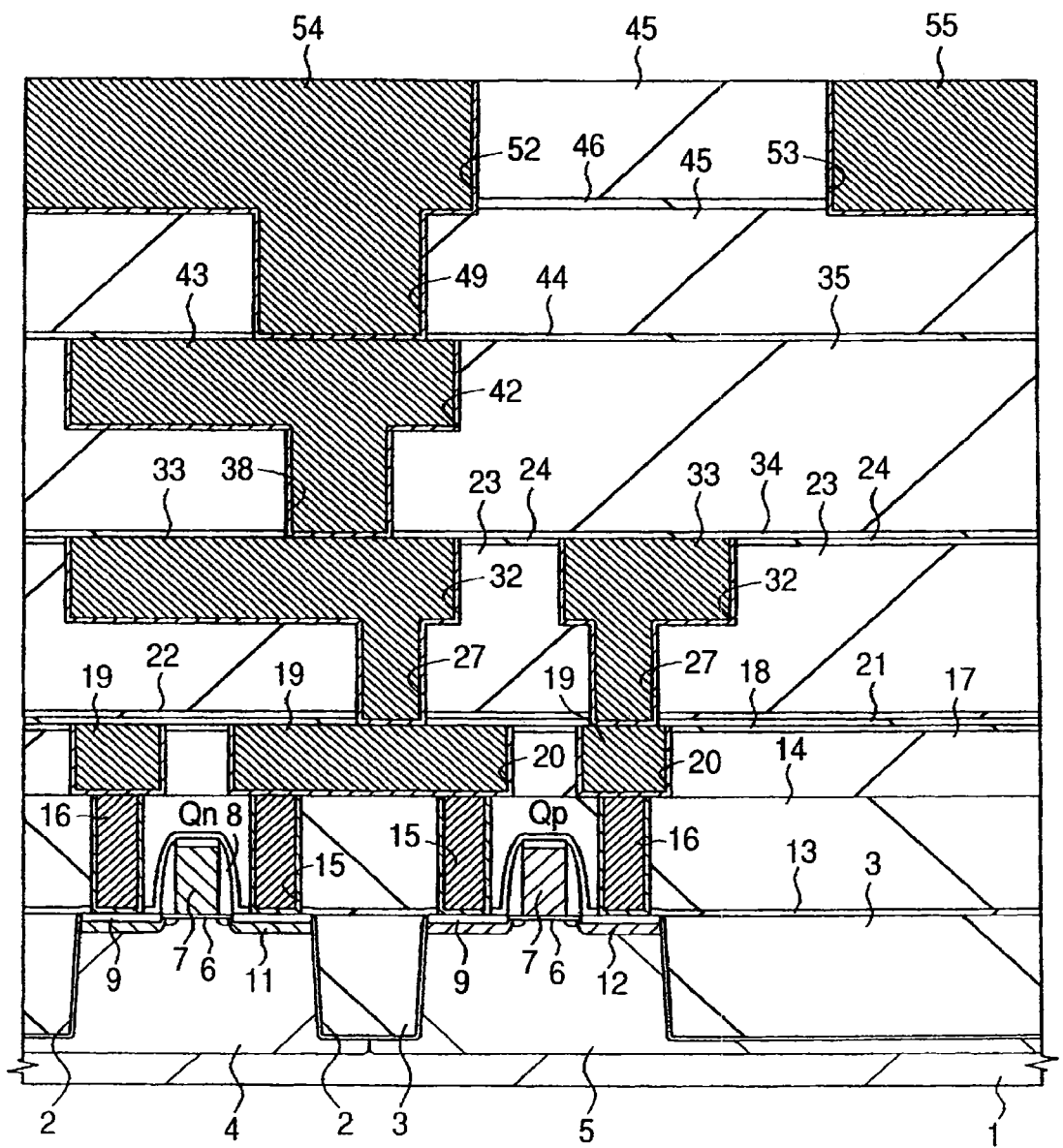
FIG. 30 is a fragmentary cross-sectional view of a semiconductor substrate illustrating a manufacturing step of a semiconductor integrated circuit device following that of FIG. 29.

As illustrated in FIG. 29, after formation of a photoresist film over the interlayer insulating film 45, the interlayer insulating film 45 and barrier insulating film 44 are dry etched with the photoresist film 48 as a mask, whereby a via hole 38 is formed and the third-level interconnect 43 is exposed from the bottom of the via hole 38. In this case, the stopper film 46 functions as an antireflective film so that lowering of resolution, which will otherwise occur by an exposure light reflecting from the surface of the third-level interconnect 43 and incident on the photoresist film 48, can be suppressed.

After removal of the photoresist film 48, a fourth-level interconnect 54 is formed in the interconnect trench 52 and via hole 49, and a fuse 55 is formed in the interconnect trench 53. The fourth-level interconnect 54 and fuse 55 are formed in a similar manner to that described in Embodiment 1.

It is possible to simplify the formation step of the fourth-level interconnect 54 also in this Embodiment in which the via hole 38 is formed after the formation of the interconnect trenches 52 and 53 in the interlayer insulating film 45. In addition, the fourth-level interconnect 54 can be formed in a high yield.

The present invention made by the present inventors was described specifically based on some embodiments. The present invention is not limited to these embodiments but it is needless to say that changes may be made without departing from the scope of the present invention. For example, the present invention can be applied to a manufacturing method of a semiconductor device having five or more Cu interconnect layers.

The present invention is effective when applied to a semiconductor integrated circuit device having a multilevel interconnect formed by the dual damascene process.

The invention claimed is:

1. A method of manufacturing a semiconductor integrated circuit device, comprising:
   (a) forming a first interconnect over a main surface of a semiconductor substrate;
   (b) forming a first interlayer insulating film over the first interconnect;
   (c) forming a first via hole in the first interlayer insulating film for connecting to the first interconnect;
   (d) forming a first interconnect trench in the first interlayer insulating film in a region including a region in which the first via hole has been formed;
   (e) filling a metal film in the first interconnect trench and the first via hole so as to form a second interconnect;
   (f) forming a third interconnect over the second interconnect and the first interlayer insulating film;

(g) forming a second interlayer insulating film over the third interconnect;
(h) forming a second via hole in the second interlayer insulating film for connecting to the third interconnect;
(i) forming a second interconnect trench in the second interlayer insulating film in a region including a region in which the second via hole has been formed; and
(j) filling a metal film in the second interconnect trench and the second via hole so as to form a fourth interconnect, wherein the second interlayer insulating film is thicker than the first interlayer insulating film,
step (g) includes forming a first etching stopper film in the second interlayer insulating film,
a bottom of the second interconnect trench is arranged near the first etching stopper film,
a depth of the second interconnect trench is greater than a depth of the first interconnect trench,
a dielectric constant of the first interlayer insulating film is lower than a dielectric constant of the second interlayer insulating film,
a diameter of the second via hole is greater than a diameter of the first via hole,
in step (b), the first interlayer insulating film is formed so as to include a first barrier insulating film in contact with a surface of the first interconnect so as to prevent diffusion of copper,
in step (g), the second interlayer insulating film is formed so as to include a second barrier insulating film in contact with a surface of the third interconnect so as to prevent diffusion of copper,
the first and second barrier insulating films include silicon, carbon, and nitrogen,
the first etching stopper film includes silicon and nitrogen, and
dielectric constants of the first and second barrier insulating films are less than a dielectric constant of the first etching stopper film.

2. The method of manufacturing a semiconductor integrated circuit device according to claim 1, wherein the first interlayer insulating film is formed with no etching stopper film therein.

3. The method of manufacturing a semiconductor integrated circuit device according to claim 1, wherein the first interconnect trench is shallower than the first via hole, and the second interconnect trench is shallower than the second via hole.

4. The method of manufacturing a semiconductor integrated circuit device according to claim 1, wherein the second via hole is deeper than the first via hole.

5. The method of manufacturing a semiconductor integrated circuit device according to claim 1, wherein the first, second, third, and fourth interconnects have copper as a main component.

6. A method of manufacturing a semiconductor integrated circuit device, comprising:
(a) forming a first interconnect over a semiconductor substrate;
(b) forming a first interlayer insulating film over the first interconnect;
(c) forming a first via hole in the first interlayer insulating film for connecting to the first interconnect;
(d) forming a first interconnect trench in the first interlayer insulating film for connecting to the first via hole;
(e) filling a metal film in the first interconnect trench and the first via hole so as to form together a second interconnect and a first connection portion;
(f) forming a third interconnect over the second interconnect and the first interlayer insulating film;
(g) forming a second interlayer insulating film over the third interconnect;
(h) forming a second via hole in the second interlayer insulating film for connecting to the third interconnect;
(i) forming a second interconnect trench in the second interlayer insulating film for connecting to the second via hole; and
(j) filling a metal film in the second interconnect trench and the second via hole so as to form together a fourth interconnect and a second connection portion,
wherein a thickness of the second interlayer insulating film is larger than a thickness of the first interlayer insulating film,
a depth of the second interconnect trench is greater than a depth of the first interconnect trench,
the second interlayer insulating film is divided by a stopper film provided therein,
a bottom of the fourth interconnect is arranged substantially at a level of the stopper film,
a bottom of the second interconnect is arranged on the first interlayer insulating film,
a dielectric constant of the first interlayer insulating film is lower than a dielectric constant of the second interlayer insulating film,
a diameter of the second via hole is greater than a diameter of the first via hole,
in step (b), the first interlayer insulating film is formed so as to include a first barrier insulating film in contact with a surface of the first interconnect so as to prevent diffusion of copper,
in step (g), the second interlayer insulating film is formed so as to include a second barrier insulating film in contact with a surface of the third interconnect so as to prevent diffusion of copper,
the first and second barrier insulating films include silicon, carbon, and nitrogen,
the first, second, third, and fourth interconnects have copper as a main component,
the stopper film is formed of a different material from the first and second barrier insulating films,
the stopper film includes silicon and nitrogen, and
dielectric constants of the first and second barrier insulating films are less than a dielectric constant of the stopper film.

7. The method of manufacturing a semiconductor integrated circuit device according to claim 6, wherein a depth of the second via hole is greater than a depth of the first via hole.

8. The method of manufacturing a semiconductor integrated circuit device according to claim 6, wherein step (e) includes, prior to the filling the metal film in the first interconnect trench and the first via hole, forming a first barrier metal inside of the first interconnect trench and the first via hole such that the first barrier metal is between the first interlayer insulating film and the metal film of the second interconnect after the filling.

9. The method of manufacturing a semiconductor integrated circuit device according to claim 6, wherein step (j) includes, prior to the filling the metal film in the second interconnect trench and the second via hole, forming a second barrier metal inside of the second interconnect trench and the second via hole such that the second barrier metal is between the second interlayer insulating film and the metal film of the fourth interconnect after the filling.

10. The method of manufacturing a semiconductor integrated circuit device according to claim 6, wherein the first interlayer insulating film has an SiOC film as a main component.

11. The method of manufacturing a semiconductor integrated circuit device according to claim 6, wherein the second interlayer insulating film has a silicon oxide film as a main component.

12. The method of manufacturing a semiconductor integrated circuit device according to claim 6, wherein the second interlayer insulating film has a fluorinated silicon oxide film as a main component.

13. The method of manufacturing a semiconductor integrated circuit device according to claim 6, wherein the stopper film is an SiN film or an SiON film.

14. The method of manufacturing a semiconductor integrated circuit device according to claim 6, wherein the first interlayer insulating film is formed with no etching stopper film therein.

15. A method of manufacturing a semiconductor integrated circuit device, comprising:
(a) forming a first interconnect over a semiconductor substrate;
(b) forming a first interlayer insulating film over the first interconnect;
(c) forming a first via hole in the first interlayer insulating film for connecting to the first interconnect;
(d) forming a first interconnect trench in the first interlayer insulating film for connecting to the first via hole;
(e) filling a metal film in the first interconnect trench and the first via hole so as to form together a second interconnect and first connection portion;
(f) forming a third interconnect over the second interconnect and the first interlayer insulating film;
(g) forming a second interlayer insulating film over the third interconnect;
(h) forming a second via hole in the second interlayer insulating film for connecting to the third interconnect;
(i) forming a second interconnect trench in the second interlayer insulating film for connecting to the second via hole; and
(j) filling a metal film in the second interconnect trench and the second via hole so as to form together a fourth interconnect and a second connection portion,
wherein a thickness of the second interlayer insulating film is larger than a thickness of the first interlayer insulating film,
a depth of the second interconnect trench is greater than a depth of the first interconnect trench,
a depth of the second via hole is greater than a depth of the first via hole,
the second interlayer insulating film is divided by a stopper film provided therein,
a bottom of the fourth interconnect is arranged substantially at a level of the stopper film,
a bottom of the second interconnect is arranged on the first interlayer insulating film,
a diameter of the second via hole is greater than a diameter of the first via hole,
in step (b), the first interlayer insulating film is formed so as to include a first barrier insulating film in contact with a surface of the first interconnect so as to prevent diffusion of copper,
in step (g), the second interlayer insulating film is formed so as to include a second barrier insulating film in contact with a surface of the third interconnect so as to prevent diffusion of copper,
the first and second barrier insulating films include silicon, carbon, and nitrogen,
the first, second, third and fourth interconnects are made of copper as a main component,
the stopper film is formed of a different material from the first and second barrier insulating films,
the first interlayer insulating film has SiOC as a main component,
the second interlayer insulating film has silicon oxide or fluorinated silicon oxide as a main component,
the stopper film includes silicon and nitrogen, and
dielectric constants of the first and second barrier insulating films are less than a dielectric constant of the stopper film.

16. The method of manufacturing a semiconductor integrated circuit device according to claim 15, wherein step (e) includes, prior to the filling the metal film in the first interconnect trench and the first via hole, forming a first barrier metal inside of the first interconnect trench and the first via hole such that the first barrier metal is between the first interlayer insulating film and the metal film of the second interconnect after the filling.

17. The method of manufacturing a semiconductor integrated circuit device according to claim 15, wherein step (j) includes, prior to the filling the metal film in the second interconnect trench and the second via hole, forming a second barrier metal inside of the second interconnect trench and the second via hole such that the second barrier metal is between the second interlayer insulating film and the metal film of the fourth interconnect after the filling.

18. The method of manufacturing a semiconductor integrated circuit device according to claim 15, wherein the first interlayer insulating film is formed with no etching stopper film therein.

19. The method of manufacturing a semiconductor integrated circuit device according to claim 15, wherein the stopper film is an SiN film or an SiON film.

* * * * *